(12) United States Patent
Moon et al.

(10) Patent No.: US 11,769,547 B2
(45) Date of Patent: Sep. 26, 2023

(54) MEMORY DEVICE TRANSMITTING AND RECEIVING DATA AT HIGH SPEED AND LOW POWER

(71) Applicant: SAMSUNG ELECTRONICS CO., LTD., Suwon-si (KR)

(72) Inventors: Byongmo Moon, Seoul (KR); Jihye Kim, Suwon-si (KR); Je Min Ryu, Seoul (KR); Beomyong Kil, Suwon-si (KR); Sungoh Ahn, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/685,067

(22) Filed: Mar. 2, 2022

(65) Prior Publication Data

US 2022/0310154 A1    Sep. 29, 2022

Related U.S. Application Data

(63) Continuation of application No. 17/084,345, filed on Oct. 29, 2020, now Pat. No. 11,295,808.

(30) Foreign Application Priority Data

Jan. 21, 2020 (KR) .................. 10-2020-0008110
May 22, 2020 (KR) .................. 10-2020-0061441

(51) Int. Cl.
*G11C 11/4076* (2006.01)
*G11C 11/4093* (2006.01)
*G06F 3/06* (2006.01)
*G11C 11/4096* (2006.01)
*H01L 25/18* (2023.01)

(52) U.S. Cl.
CPC ........ *G11C 11/4093* (2013.01); *G06F 3/0604* (2013.01); *G06F 3/0659* (2013.01); *G06F 3/0679* (2013.01); *G11C 11/4076* (2013.01); *G11C 11/4096* (2013.01); *H01L 25/18* (2013.01)

(58) Field of Classification Search
CPC .................................................. G11C 11/4093
See application file for complete search history.

(56) References Cited

U.S. PATENT DOCUMENTS 6,034,916 A    3/2000 Lee
6,922,367 B2   7/2005 Morzano et al.
(Continued)

FOREIGN PATENT DOCUMENTS

KR    10-1791456 B1    10/2017

OTHER PUBLICATIONS

Communication dated May 26, 2021, issued by the European Patent Office in counterpart European Application No. 21151943.4.

*Primary Examiner* — Min Huang
(74) *Attorney, Agent, or Firm* — Sughrue Mion, PLLC

(57) ABSTRACT

A method for using a high bandwidth memory controller includes providing a clock signal having a first clock frequency, providing a write strobe signal having a second clock frequency, providing a write command/address signal based on the clock signal, and providing a write data signal based on the write strobe signal. The first clock frequency is half of the second clock frequency, the write strobe signal has two cycles of pre-amble before the write data signal, and the write strobe signal has two cycles of post-amble after the write data signal.

19 Claims, 21 Drawing Sheets

(56) References Cited

U.S. PATENT DOCUMENTS

| | | |
|---|---|---|
| 8,031,539 B2 | 10/2011 | Gregorius |
| 8,238,186 B2 | 8/2012 | Bae et al. |
| 8,300,482 B2 | 10/2012 | Bae |
| 8,427,892 B2 * | 4/2013 | Venkataraman .... G06F 13/1689 |
| | | 365/194 |
| 8,593,901 B2 | 11/2013 | Oh et al. |
| 8,937,490 B2 | 1/2015 | Moon et al. |
| 10,255,964 B2 | 4/2019 | Shin et al. |
| 11,295,808 B2 * | 4/2022 | Moon ................. G11C 11/4072 |
| 2011/0055671 A1 | 3/2011 | Kim et al. |
| 2014/0233292 A1 | 8/2014 | Kang et al. |
| 2017/0062029 A1 * | 3/2017 | Song ......................... G06F 1/12 |
| 2017/0084320 A1 | 3/2017 | Kim et al. |
| 2019/0259446 A1 | 8/2019 | Penney |
| 2020/0020368 A1 * | 1/2020 | Yoon ..................... G11C 7/222 |

\* cited by examiner

MEMORY DEVICE TRANSMITTING AND RECEIVING DATA AT HIGH SPEED AND LOW POWER

CROSS-REFERENCE TO RELATED APPLICATIONS

This application is a Continuation Application of U.S. application Ser. No. 17/084,345 filed on Oct. 29, 2020, which claims priority under 35 U.S.C. § 119 to Korean Patent Application No. 10-2020-0008110 filed on Jan. 21, 2020 and Korean Patent Application No. 10-2020-0061441 filed on May 22, 2020, in the Korean Intellectual Property Office, the disclosures of each of which are incorporated by reference herein in their entireties.

BACKGROUND

1. Field

Embodiments relate to a semiconductor device, and more particularly, relate to a memory device transmitting and receiving data at high speed and low power.

2. Description of Related Art

Electronic devices such as a smartphone, a graphics accelerator, and an artificial intelligence (AI) accelerator process data by using a memory device such as a dynamic random access memory (DRAM). As the amount of data to be processed by the electronic devices increases, a high-capacity and high-bandwidth memory device is being required. In particular, there is an increasing use of a memory device, which provides a wide input/output of a multi-channel interface manner, such as a high bandwidth memory for the purpose of processing data at high speed.

When a memory device supports a high bandwidth, data may be transmitted between a memory controller and the memory device at high speed. To secure the integrity of data when the data are transmitted at high speed, a data strobe signal may be exchanged between the memory controller and the memory device. The data strobe signal may toggle between a high level and a low level periodically while a data signal is transmitted between the memory controller and the memory device. As such, the data strobe signal may provide timing information for latching a level of the data signal. That is, in the case in which data are transmitted at high speed, a data strobe signal having a high frequency may be required. However, the data exchange based on the data strobe signal having a high frequency may cause an increase in power consumption of the memory device.

SUMMARY

It is an aspect to provide a memory device transmitting and receiving data at high speed and low power.

According to an aspect of an exemplary embodiment, there is provided a memory device comprising a buffer die configured to communicate with a host device through a plurality of channels, each of which constitutes an independent interface; and a plurality of core dies stacked on the buffer die through a silicon through electrode, each of the plurality of core dies including a memory cell array corresponding to at least one of the plurality of channels. The buffer die includes a command/address receiver configured to receive a command provided from the host device to a first channel of the plurality of channels, based on a clock signal provided from the host device to the first channel; a control logic circuit configured to generate an internal command depending on the command received from the command/address receiver and to generate a reset signal before a write data strobe signal provided from the host device to the first channel starts to toggle; a write data strobe signal divider configured to generate a plurality of internal write data strobe signals that toggle depending on toggling of the write data strobe signal, the plurality of internal write data strobe signals toggling with different phases, respectively, and to initialize the plurality of internal write data strobe signals to given values in response to the reset signal; and a data transceiver configured to receive write data provided from the host device to the first channel based on the plurality of internal write data strobe signals, wherein a core die from among the plurality of core dies that supports the first channel is configured to store the write data transmitted from the buffer die in response to the internal command transmitted from the buffer die.

According to another aspect of an exemplary embodiment, there is provided a memory device comprising a buffer die configured to communicate with a host device through a plurality of channels, each of which constitutes an independent interface; and a first core die stacked on the buffer die through a silicon through electrode and including a first memory cell array corresponding to a first channel of the plurality of channels; and a second core die stacked on the first core die through the silicon through electrode and including a second memory cell array corresponding to the first channel. The buffer die includes a command/address receiver configured to receive a command and a stack identifier provided from the host device to the first channel, based on a clock signal provided from the host device to the first channel; a control logic circuit configured to generate an internal command depending on the command received from the command/address receiver and to generate a reset signal before a write data strobe signal provided from the host device to the first channel starts to toggle; a write data strobe signal divider configured to generate a plurality of internal write data strobe signals that toggle depending on toggling of the write data strobe signal, the plurality of internal write data strobe signals toggling with different phases, respectively, and to initialize the plurality of internal write data strobe signals to given values in response to the reset signal; and a data transceiver configured to receive write data provided from the host device to the first channel based on the plurality of internal write data strobe signals, wherein a core die corresponding to the stack identifier from among the first core die and the second core die is configured to store the write data transmitted from the buffer die in response to the internal command transmitted from the buffer die.

According to yet another aspect of an exemplary embodiment, there is provided a memory device comprising a buffer die configured to communicate with a host device through a plurality of channels, each of which constitutes an independent interface; and a plurality of core dies stacked on the buffer die through a silicon through electrode, wherein each of the plurality of core dies includes a memory cell array corresponding to at least one of the plurality of channels, wherein the buffer die is configured to receive a command provided from the host device to a first channel based on a clock signal provided from the host device to the first channel; initialize a plurality of internal write data strobe signals to given values before a write data strobe signal provided from the host device to the first channel starts to toggle; generate the plurality of internal write data strobe signals that toggle depending on toggling of the write data strobe signal, the plurality of internal write data strobe signals toggling with different phases, respectively; and receive write data provided from the host device to the first channel based on the plurality of internal write data strobe signals, wherein a core die supporting the first channel from among the plurality of core dies is configured to store the received write data.

According to yet another aspect of an exemplary embodiment, there is provided a semiconductor package includes a package substrate, an interposer substrate that is stacked on the package substrate, a system on chip that is stacked on the interposer substrate and includes at least one processor and a memory controller, and a memory device that includes a buffer die stacked on the interposer substrate and communicating with the system on chip through the interposer substrate and a plurality of core dies stacked on the buffer die through a silicon through electrode. The buffer die is configured to receive a write command provided from the memory controller based on a clock signal provided from the memory controller, to initialize a plurality of internal write data strobe signals to given values before a write data strobe signal provided from the memory controller toggles, to generate the plurality of internal write data strobe signals toggling depending on toggling of the write data strobe signal, the plurality of internal write data strobe signals toggling with different phases, and to receive write data provided from the memory controller based on the plurality of internal write data strobe signals. One of the plurality of core dies stores the received write data. A sum of a number of pre-amble cycles of the write data strobe signal and a number of post-amble cycles of the write data strobe signal is even-numbered.

BRIEF DESCRIPTION OF THE FIGURES

The above and other aspects will become apparent by describing in detail exemplary embodiments thereof with reference to the accompanying drawings, in which.

DETAILED DESCRIPTION

Below, embodiments will be described in detail and clearly to such an extent that one of ordinary skill in the art may easily implement the embodiments of the present disclosure.

Figure 1:
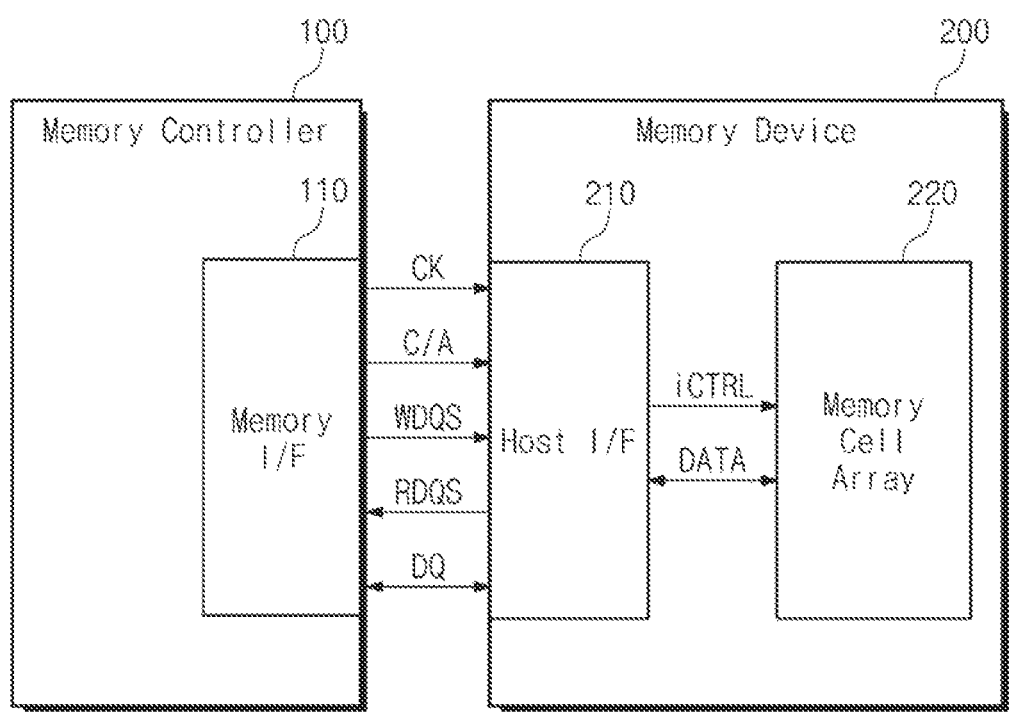
FIG. 1 is a block diagram illustrating a memory system according to an embodiment.

FIG. 1 is a block diagram illustrating a memory system according to an embodiment. Referring to FIG. 1, a memory system 10 may include a memory controller 100 and a memory device 200. The memory controller 100 may control overall operations of the memory device 200. For example, the memory controller 100 may control the memory device 200 such that data are output from the memory device 200 or data are stored in the memory device 200. For example, the memory controller 100 may be implemented as, but is not limited to, a part of a system on chip (SoC).

The memory controller 100 may include a memory interface (I/F) 110. Through the memory interface 110, the memory controller 100 may transmit various signals to the memory device 200 and may receive various signals from the memory device 200. For example, as illustrated in FIG. 1, through the memory interface 110, the memory controller 100 may transmit a clock signal CK, a command/address signal C/A, a write data strobe signal WDQS, and a data signal DQ to the memory device 200 and may receive a read data strobe signal RDQS and the data signal DQ from the memory device 200.

The memory device 200 may operate under control of the memory controller 100. For example, under control of the memory controller 100, the memory device 200 may output the stored data or may store data provided from the memory controller 100.

The memory device 200 may include a host interface (I/F) 210 and a memory cell array 220. Through the host interface 210, the memory device 200 may transmit various signals to the memory controller 100 and may receive various signals from the memory controller 100. For example, through the host interface 210, the memory device 200 may transmit the read data strobe signal RDQS and the data signal DQ to the memory controller 100 and may receive the clock signal CK, the command/address signal C/A, the write data strobe signal WDQS, and the data signal DQ from the memory controller 100. The host interface 210 may generate control signals iCTRL based on a signal provided from the memory controller 100. In response to the control signals iCTRL, the memory cell array 220 may store data "DATA" or may output the stored data "DATA".

The memory cell array 220 may include a plurality of memory cells. For example, a memory cell may be a dynamic random access memory (DRAM) cell. In this case, the memory interface 110 and the host interface 210 may communicate with each other based on one of standards such as a double data rate (DDR), a low power double data rate (LPDDR), a graphics double data rate (GDDR), a wide I/O, a high bandwidth memory (HBM), and/or a hybrid memory cube (HMC), etc.

The memory interface 110 may generate the clock signal CK and may transmit the clock signal CK to the memory device 200. In some embodiments, the clock signal CK may be a differential signal. The clock signal CK may be a signal that toggles between a high level and a low level periodically. The memory interface 110 may transmit the command/address signal C/A to the memory device 200 based on toggle timings of the clock signal CK.

The memory interface 110 may generate the write data strobe signal WDQS and may transmit the write data strobe signal WDQS to the memory device 200. In some embodiments, the write data strobe signal WDQS may be a differential signal. For a write operation and a read operation of the memory device 200, the memory interface 110 may generate the write data strobe signal WDQS that toggles between the high level and the low level periodically. The memory interface 110 may transmit the data signal DQ to the memory device 200 based on toggle timings of the write data strobe signal WDQS.

The memory interface 110 may receive the read data strobe signal RDQS from the memory device 200. In some embodiments, the read data strobe signal RDQS may be a differential signal. The memory interface 110 may receive the data signal DQ from the memory device 200 and may latch the received data signal DQ based on toggle timings of the read data strobe signal RDQS. As such, the memory interface 110 may receive the data "DATA" included in the data signal DQ.

The host interface 210 may receive the clock signal CK from the memory controller 100. The host interface 210 may receive the command/address signal C/A from the memory controller 100 and may latch the command/address signal C/A based on the toggle timings (e.g., a rising edge and/or a falling edge) of the clock signal CK. As such, the host interface 210 may receive a command or an address included in the command/address signal C/A.

An example is illustrated in FIG. 1 in which a command and an address are transmitted from the memory controller 100 to the memory device 200 by using the same input/output channel, but embodiments are not limited thereto. For example, in some embodiments, a command and an address may be transmitted from the memory controller 100 to the memory device 200 by using different input/output channels.

The host interface 210 may receive the write data strobe signal WDQS from the memory controller 100. The host interface 210 may receive the data signal DQ and may latch the data signal DQ based on the toggle timings (e.g., a rising edge and/or a falling edge) of the write data strobe signal WDQS. As such, the host interface 210 may receive the data "DATA" included in the data signal DQ.

The host interface 210 may generate the read data strobe signal RDQS and may transmit the read data strobe signal RDQS to the memory controller 100. The host interface 210 may generate the read data strobe signal RDQS that toggles between the high level and the low level periodically in the read operation of the memory device 200. In an exemplary embodiment, the host interface 210 may generate the read data strobe signal RDQS based on the write data strobe signal WDQS received from the memory controller 100. The host interface 210 may transmit the data signal DQ to the memory controller 100 based on toggle timings of the read data strobe signal RDQS.

In an exemplary embodiment, each of the write data strobe signal WDQS and the read data strobe signal RDQS may have a frequency that is two times higher than a frequency of the clock signal CK. When the data signal DQ is transmitted based on the data strobe signals WDQS and RDQS, the memory controller 100 and the memory device 200 may transmit and receive data at high speed.

Figure 2:
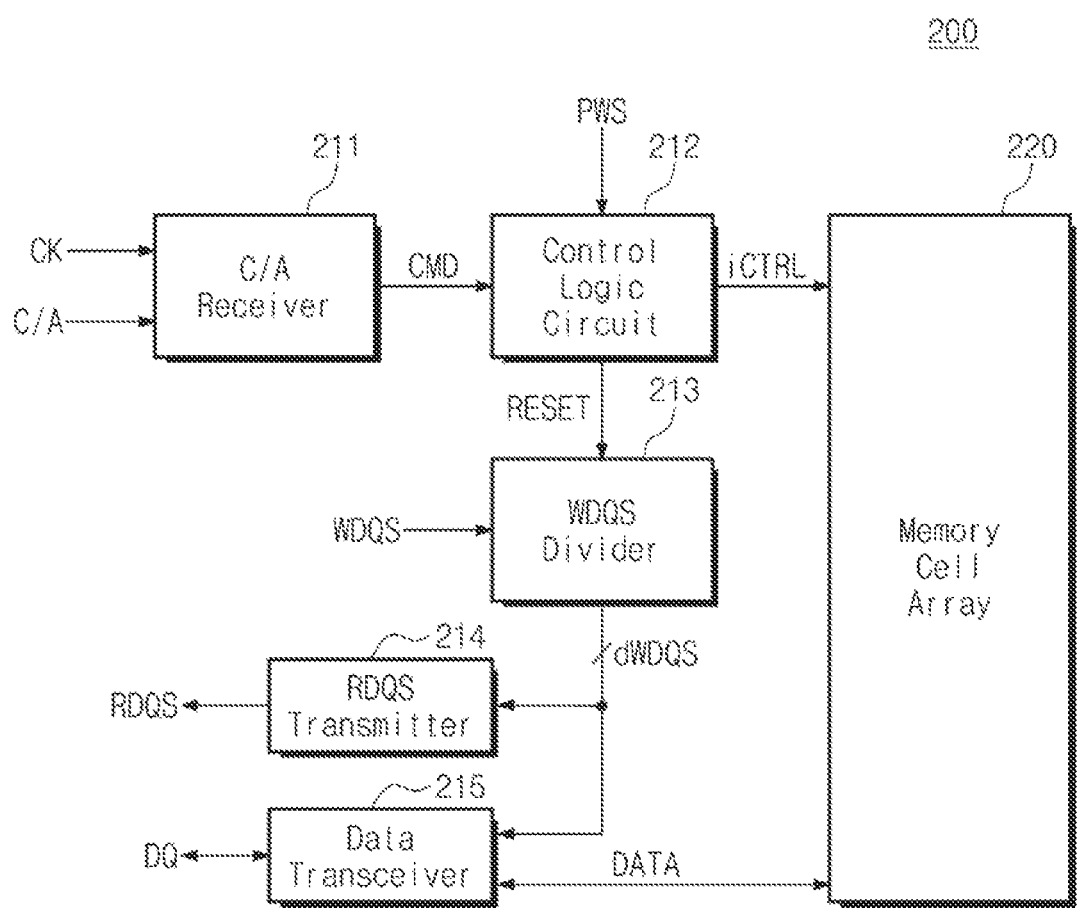
FIG. 2 is an exemplary block diagram illustrating a memory device of the memory system of FIG. 1.

FIG. 2 is an exemplary block diagram illustrating a memory device of the memory system of FIG. 1. Referring to FIG. 2, the memory device 200 may include a command/address (CA) receiver 211, a control logic circuit 212, a write data strobe signal (WDQS) divider 213, a read data strobe signal (RDQS) transmitter 214, a data transceiver 215, and the memory cell array 220. In some embodiments, the C/A receiver 211, the control logic circuit 212, the WDQS divider 213, the RDQS transmitter 214, and the data transceiver 215 may be included in the host interface 210 of FIG. 1.

The C/A receiver 211 may receive a command CMD by latching the command/address signal C/A based on the clock signal CK. The received command CMD may be provided to the control logic circuit 212. Although not illustrated in FIG. 2, the C/A receiver 211 may receive an address by latching the command/address signal C/A based on the clock signal CK. The received address may be provided to an address register placed inside or outside the control logic circuit 212 so as to be decoded.

The control logic circuit 212 may decode the received command CMD and may generate control signals for controlling any other components of the memory device 200 depending on a result of decoding the command CMD. For example, the control logic circuit 212 may generate the control signals iCTRL for storing the data "DATA" in the memory cell array 220 or outputting the data "DATA" from the memory cell array 220, based on the result of decoding the command CMD. For example, the control logic circuit 212 may generate a reset signal RESET for resetting the WDQS divider 213, based on the result of decoding the command CMD.

The control logic circuit 212 may receive power state information PWS of the memory device 200. For example, in some embodiments, the control logic circuit 212 may receive the power state information PWS from the outside the memory device 200 or from outside the memory system 10 (e.g., from a host device). In other embodiments, the power state information PWS may be generated by the memory device 200. For example, the power state information PWS may include voltage information that is provided to the memory device 200 or is generated by the memory device 200. The control logic circuit 212 may determine a power state of the memory device 200 based on the power state information PWS. For example, based on the power state information PWS, the control logic circuit 212 may determine whether the memory device 200 is in a power-up state or whether the memory device 200 is in a power down exit state.

The control logic circuit 212 may generate the reset signal RESET for resetting the WDQS divider 213. The control logic circuit 212 may generate the reset signal RESET before the write data strobe signal WDQS provided from the memory controller 100 toggles. In some exemplary embodiments, the control logic circuit 212 may generate the reset signal RESET based on the command CMD or the power state information PWS. Conditions for generating the reset signal RESET by the control logic circuit 212 will be more fully described with reference to FIG. 3.

The WDQS divider 213 may generate a plurality of internal write data strobe signals dWDQS based on the write data strobe signal WDQS. In detail, the WDQS divider 213 may generate the internal write data strobe signals dWDQS that toggle depending on toggling of the write data strobe signal WDQS. The WDQS divider 213 may divide a frequency of the write data strobe signal WDQS to generate the internal write data strobe signals dWDQS having different phases. For example, the WDQS divider 213 may halve the frequency of the write data strobe signal WDQS to generate the four internal write data strobe signals dWDQS having different phases. In this case, the phases of the internal write data strobe signals dWDQS may be 0 degree, 90 degrees, 180 degrees, and 270 degrees.

Before the write data strobe signal WDQS toggles, the WDQS divider 213 may initialize the internal write data strobe signals dWDQS to given values in response to the reset signal RESET. Each of the internal write data strobe signals dWDQS may be initialized to a given value (hereinafter referred to as a "reset value") of the high level or the low level. In an exemplary embodiment, the WDQS divider 213 may initialize half of the internal write data strobe signals dWDQS to the low level and may initialize the other half to the high level. The internal write data strobe signals dWDQS may maintain the reset values until the write data strobe signal WDQS toggles.

In the case where the internal write data strobe signals dWDQS are maintained at the reset values depending on the reset operation, the WDQS divider 213 may generate the internal write data strobe signals dWDQS having desired phases. As such, the memory device 200 may not separately perform auto-synchronization for synchronizing the phases of the internal write data strobe signals dWDQS with the clock signal CK.

The RDQS transmitter 214 may generate the read data strobe signal RDQS based on the internal write data strobe signals dWDQS and may transmit the read data strobe signal RDQS to the memory controller 100. For example, the RDQS transmitter 214 may transmit the read data strobe signal RDQS based on rising edges and/or falling edges of the internal write data strobe signals dWDQS. A frequency of the read data strobe signal RDQS that is transmitted to the memory controller 100 may be equal to a frequency of the write data strobe signal WDQS.

The data transceiver 215 may transmit and receive the data signal DQ including the data "DATA" based on the internal write data strobe signals dWDQS. In the write operation, the data transceiver 215 may receive the data "DATA" by latching the data signal DQ based on the internal write data strobe signals dWDQS. For example, the data transceiver 215 may latch the data signal DQ received from the memory controller 100 based on rising edges and/or falling edges of the internal write data strobe signals dWDQS. The received data "DATA" may be provided to and stored in the memory cell array 220. In an exemplary embodiment, when the data "DATA" are transferred to the memory cell array 220, the data "DATA" may be transferred based on toggle timings of the clock signal CK. That is, in the case where the data "DATA" are transferred to the memory cell array 220, a domain may be changed from a domain of the write data strobe signal WDQS to a domain of the clock signal CK.

In the read operation, the data transceiver 215 may transmit the data signal DQ including the data "DATA" to the memory controller 100 based on the internal write data strobe signals dWDQS. The data "DATA" may be read from the memory cell array 220. For example, the data transceiver 215 may transmit the data "DATA" based on rising edges and/or falling edges of the internal write data strobe signals dWDQS. As such, the data "DATA" may be aligned with toggle timings of the read data strobe signal RDQS and may be transmitted to the memory controller 100. In an exemplary embodiment, when the data "DATA" are read from the memory cell array 220, the data "DATA" may be read based on toggle timings of the clock signal CK. The data transceiver 215 may align the read data "DATA" with toggle timings of the read data strobe signal RDQS so as to be transmitted to the memory controller 100. That is, in the case where the data "DATA" are transmitted to the memory controller 100, a domain may be changed from the domain of the clock signal CK to a domain of the read data strobe signal RDQS (i.e., the domain of the write data strobe signal WDQS).

As described above, before the write data strobe signal WDQS toggles, the memory device 200 may initialize the internal write data strobe signals dWDQS to the given values. In this case, the internal write data strobe signals dWDQS that are generated as the write data strobe signal WDQS toggles may have desired phases. In the case where the internal write data strobe signals dWDQS have the desired phases, the memory device 200 may transmit and receive the data "DATA" based on the internal write data strobe signals dWDQS. As such, the memory device 200 may not separately perform the auto-synchronization for adjusting the phases of the internal write data strobe signals dWDQS. In the case where the auto-synchronization is not separately performed, the memory device 200 may not receive a separate command for the auto-synchronization and may not include a separate circuit for the auto-synchronization. In other words, a separate command for auto-synchronization may be omitted and a separate circuit for auto-synchronization may be omitted. As such, power consumption of the memory device 200 may be reduced.

As described above, the memory device 200 may generate the read data strobe signal RDQS and the data signal DQ based on the internal write data strobe signals dWDQS. Because the internal write data strobe signals dWDQS are generated based on the write data strobe signal WDQS, the read data strobe signal RDQS and the data signal DQ may be generated based on the write data strobe signal WDQS. In this case, the power consumption of the memory device 200 may be reduced compared to the case of generating the read data strobe signal RDQS and the data signal DQ based on the clock signal CK.

Figure 3:
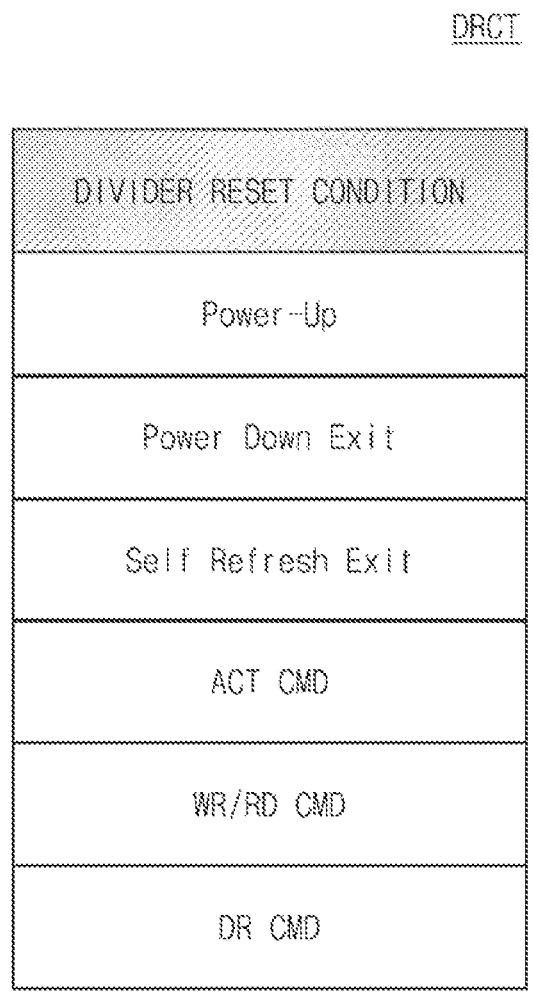
FIG. 3 is a table indicating exemplary operating conditions for generating a reset signal by a control logic circuit of the memory device of FIG. 2.

FIG. 3 is a table indicating exemplary conditions for generating a reset signal by a control logic circuit of the memory device of FIG. 2. Referring to FIGS. 2 and 3, the control logic circuit 212 may generate the reset signal RESET depending on at least one of conditions of a divider reset condition table DRCT. In the case where the command CMD is matched with a divider reset condition, or where a power state of the memory device 200 determined depending on the power state information PWS is matched with a divider reset condition, the control logic circuit 212 may generate the reset signal RESET. In this case, the control logic circuit 212 may generate the reset signal RESET before the write data strobe signal WDQS toggles.

In an exemplary embodiment, in the case where the memory device 200 is in a power-up state (i.e., after a power-up sequence of the memory device 200), the control logic circuit 212 may generate the reset signal RESET. For example, the control logic circuit 212 may determine whether the memory device 200 is in the power-up state, based on a power state of the memory device 200 determined depending on the power state information PWS.

In an exemplary embodiment, in the case where the memory device 200 is in a power down exit state (i.e., after a power down exit sequence of the memory device 200), the control logic circuit 212 may generate the reset signal RESET. For example, the control logic circuit 212 may determine whether the memory device 200 is in the power down exit state, based on a power state of the memory device 200 determined depending on the power state information PWS. Also, the control logic circuit 212 may generate the reset signal RESET in response to the command CMD indicating the power down exit.

In an exemplary embodiment, in the case where the memory device 200 is in a self refresh exit state (i.e., after a self refresh exit sequence of the memory device 200), the control logic circuit 212 may generate the reset signal RESET. For example, the control logic circuit 212 may generate the reset signal RESET in response to the command CMD indicating the self refresh exit.

In an exemplary embodiment, the control logic circuit 212 may generate the reset signal RESET in response to an active command ACT. For example, the active command ACT may be a command for enabling a selected word line of the memory cell array 220. Alternatively, the control logic circuit 212 may generate the reset signal RESET in response to a write command WR and/or a read command RD.

In an exemplary embodiment, the control logic circuit 212 may generate the reset signal RESET in response to a divider reset command DR. Here, the divider reset command DR may be a command CMD that is transmitted from the memory controller 100 and indicates a reset of the WDQS divider 213.

Figure 4:
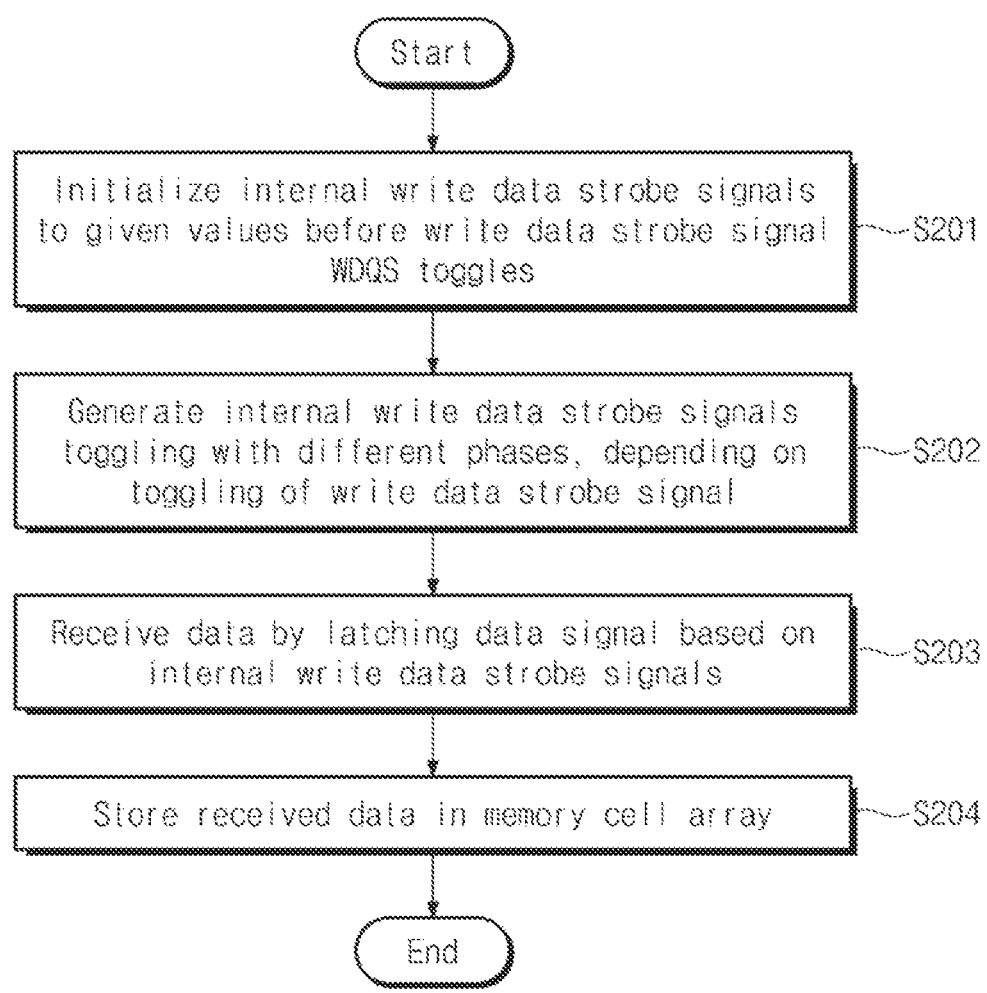
FIG. 4 is a flowchart illustrating an exemplary write operation of a memory device according to an embodiment.

FIG. 4 is a flowchart illustrating an exemplary write operation of a memory device according to an embodiment. Referring to FIGS. 2 and 4, in operation S201, before the write data strobe signal WDQS toggles, the memory device 200 may initialize the internal write data strobe signals dWDQS to given values. For example, the memory device 200 may perform the reset operation depending on the reset conditions of FIG. 3. As such, the internal write data strobe signals dWDQS may be maintained at the reset values and then start toggling.

In operation S202, the memory device 200 may generate the internal write data strobe signals dWDQS toggling with different phases, depending on toggling of the write data strobe signal WDQS. As the internal write data strobe signals dWDQS are maintained at the reset values and then start toggling, the memory device 200 may generate the internal write data strobe signals dWDQS having desired phases.

In an exemplary embodiment, while the write data strobe signal WDQS toggles, a sum of the number of pre-amble cycles of the write data strobe signal WDQS and the number of post-amble cycles of the write data strobe signal WDQS may be even-numbered. In this case, even though the toggling of the internal write data strobe signals dWDQS is stopped since the toggling of the write data strobe signal WDQS is stopped, the internal write data strobe signals dWDQS may maintain the reset values without an additional reset operation. As such, in the case where the write data strobe signal WDQS again toggles, the internal write data strobe signals dWDQS having the desired phases may be generated without an additional reset operation.

In operation S203, the memory device 200 may receive the data "DATA" by latching the data signal DQ based on the internal write data strobe signals dWDQS. In operation S204, the memory device 200 may store the received data "DATA" in the memory cell array 220.

Figure 5A:
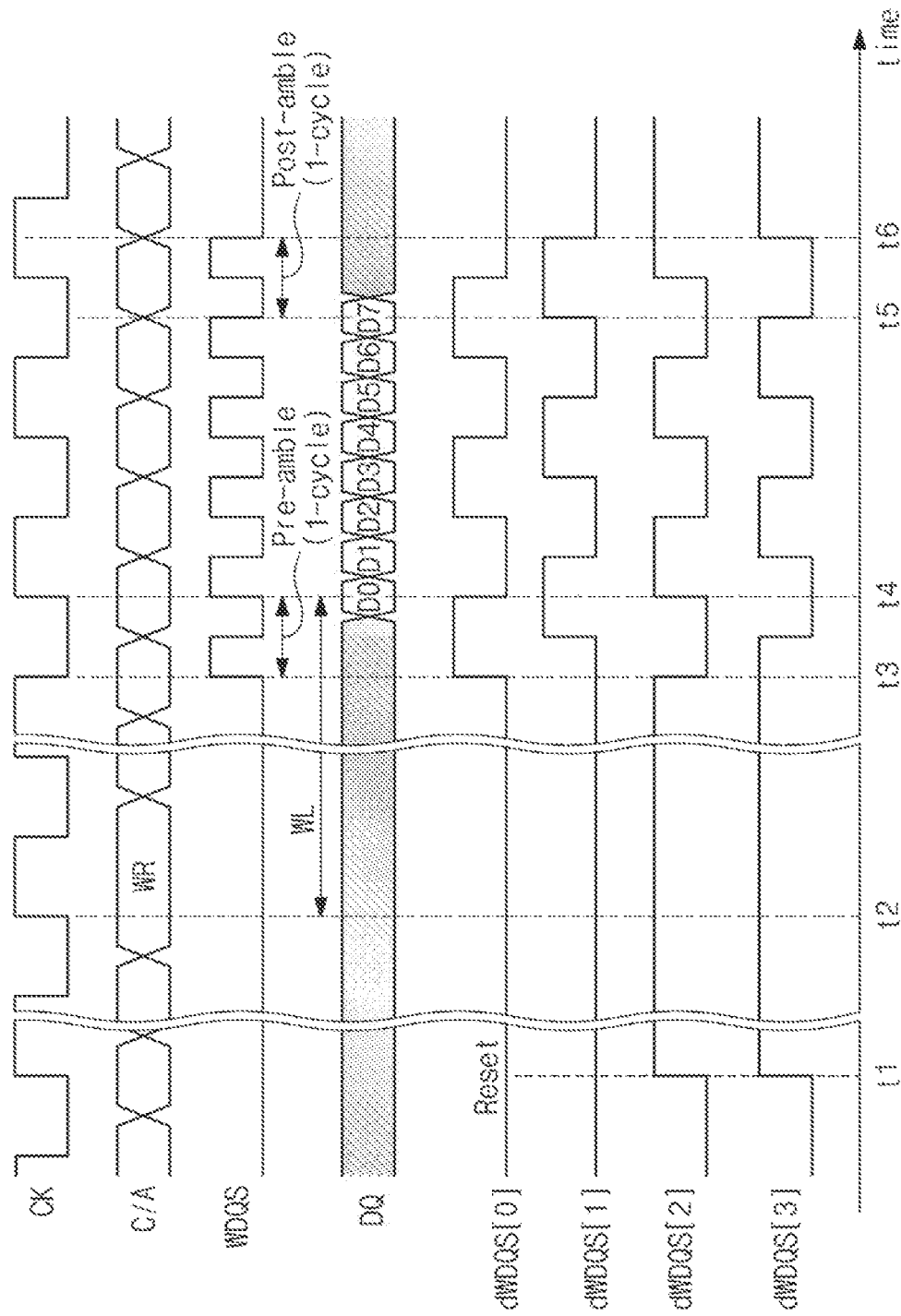
FIGS. 5A and 5B are timing diagrams illustrating examples of the write operation of FIG. 4.
Figure 5B:
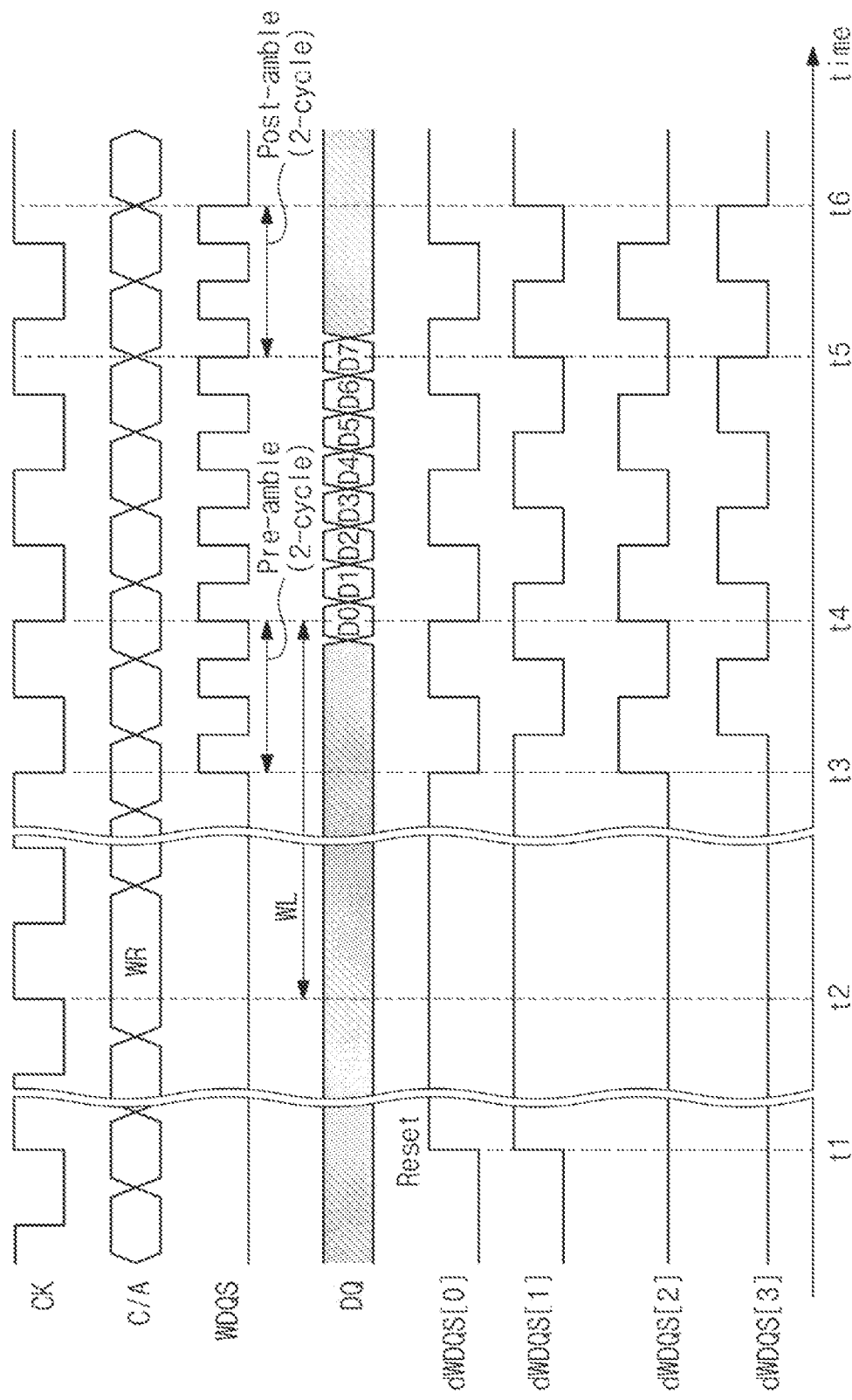

FIGS. 5A and 5B are timing diagrams illustrating examples of the write operation of FIG. 4. Referring to FIGS. 5A and 5B, the memory device 200 may receive the clock signal CK, the command/address signal C/A including the write command WR, the write data strobe signal WDQS, and the data signal DQ including data D0 to D7. Below, as illustrated in FIGS. 5A and 5B, an example will be described as the memory device 200 generates four internal write data strobe signals dWDQS[0] to dWDQS[3] toggling with different phases as the write data strobe signal WDQS toggles, but the number of internal write data strobe signals dWDQS that the memory device 200 generates may be variously determined.

Referring to FIGS. 2 and 5A, at a first time t1, the memory device 200 may initialize the internal write data strobe signals dWDQS[0] to dWDQS[3] to reset values. For example, the memory device 200 may initialize the first and second internal write data strobe signals dWDQS[0] and dWDQS[1] to the low level and may initialize the third and fourth internal write data strobe signals dWDQS[2] and dWDQS[3] to the high level.

For example, as described with reference to FIG. 3, the memory device 200 may reset the internal write data strobe signals dWDQS[0] to dWDQS[3] based on the command CMD or a power state of the memory device 200. That is, before the write data strobe signal WDQS starts toggling, the memory device 200 may reset the internal write data strobe signals dWDQS[0] to dWDQS[3] based on various reset conditions.

The memory device 200 may receive the command/ address signal C/A including the write command WR at a second time t2. The memory device 200 may receive the command CMD by latching the command/address signal C/A based on a rising edge and a falling edge of the clock signal CK. An example is illustrated in FIG. 5A as the write command WR is received during two cycles of the command/address signal C/A, but embodiments are not limited thereto.

The memory device 200 may receive the write data strobe signal WDQS that toggles from a third time t3 to a sixth time t6. Before the write data strobe signal WDQS toggles (i.e., before the third time t3), the write data strobe signal WDQS may maintain a static state. For example, the write data strobe signal WDQS may maintain the low level as illustrated in FIG. 5A. A frequency of the write data strobe signal WDQS may be two times a frequency of the clock signal CK. While the write data strobe signal WDQS toggles, the write data strobe signal WDQS may include one pre-amble cycle and one post-amble cycle. That is, a sum of the number of pre-amble cycles of the write data strobe signal WDQS and the number of post-amble cycles of the write data strobe signal WDQS may be even-numbered. An example is illustrated in FIG. 5A in which the post-amble of the write data strobe signal WDQS corresponds to a toggling period from the fifth time t5 to the sixth time t6, but embodiments are not limited thereto.

In the case where the write data strobe signal WDQS starts to toggle from the third time t3, the memory device 200 may generate the internal write data strobe signals dWDQS[0] to dWDQS[3] having desired phases based on the reset values of the internal write data strobe signals dWDQS[0] to dWDQS[3]. For example, at the third time t3, the memory device 200 may generate the first internal write data strobe signal dWDQS[0] having an edge timing identical to an edge timing of the write data strobe signal WDQS. The memory device 200 may generate the second internal write data strobe signals dWDQS[1] delayed with respect to the first internal write data strobe signal dWDQS[0] by a phase difference of 90 degrees, the third internal write data strobe signals dWDQS[2] delayed with respect to the first internal write data strobe signal dWDQS[0] by a phase difference of 180 degrees, and the fourth internal write data strobe signals dWDQS[3] delayed with respect to the first internal write data strobe signal dWDQS[0] by a phase difference of 270 degrees. In this case, a frequency of each of the internal write data strobe signals dWDQS[0] to dWDQS[3] may be half the frequency of the write data strobe signal WDQS.

At the fourth time t4 when a write latency WL elapses from the second time t2 when the write command WR is received, the memory device 200 may start to receive the data signal DQ including the data D0 to D7. The memory device 200 may receive the data D0 to D7 by latching the data signal DQ based on the internal write data strobe signals dWDQS[0] to dWDQS[3]. For example, the memory device 200 may latch the data signal DQ at a falling edge of each of the internal write data strobe signals dWDQS[0] to dWDQS[3]. In this case, the data D0 and D4 may be received based on the first internal write data strobe signal dWDQS[0], the data D1 and D5 may be received based on the second internal write data strobe signal dWDQS[1], the data D2 and D6 may be received based on the third internal write data strobe signal dWDQS[2], and the data D3 and D7 may be received based on the fourth internal write data strobe signal dWDQS[3]. As such, from the fourth time t4 to the fifth time t5, the data D0 to D7 may be received from the data signal DQ.

Since the toggling of the write data strobe signal WDQS is stopped at the sixth time t6, the toggling of the internal write data strobe signals dWDQS[0] to dWDQS[3] may be stopped. Even though the toggling of the internal write data strobe signals dWDQS[0] to dWDQS[3] is stopped, the internal write data strobe signals dWDQS[0] to dWDQS[3] may have the same values as at the first time t1. As such, after the sixth time t6, each of the internal write data strobe signals dWDQS[0] to dWDQS[3] may maintain the reset value.

Referring to FIGS. 2 and 5B, in some embodiment, the write data strobe signal WDQS may include two pre-amble cycles and two post-amble cycles. In this case, to generate the internal write data strobe signals dWDQS[0] to dWDQS [3] having desired phases (i.e., phases identical to the phases of the internal write data strobe signals dWDQS[0] to dWDQS[3] of FIG. 5A) depending on the toggling of the write data strobe signal WDQS, the memory device 200 may initialize the internal write data strobe signals dWDQS[0] to dWDQS[3] to values different from the reset values of FIG. 5A. That is, the reset values of the internal write data strobe signals dWDQS[0] to dWDQS[3] (i.e., reset values of the WDQS divider 213) may be defined depending on the number of pre-amble cycles of the write data strobe signal WDQS. An example is illustrated in FIG. 5B in which the post-amble of the write data strobe signal WDQS corresponds to a toggling period from the fifth time t5 to the sixth time t6, but embodiments are not limited thereto.

At the first time t1, the memory device 200 may initialize the first and second internal write data strobe signals dWDQS[0] and dWDQS[1] to the high level and may initialize the third and fourth internal write data strobe signals dWDQS[2] and dWDQS[3] to the low level. In this case, the internal write data strobe signals dWDQS[0] to dWDQS[3] that are generated as the write data strobe signal WDQS starts to toggle from the third time t3 may have desired phases. As such, as described with reference to FIG. 5A, the memory device 200 may receive the data D0 to D7 by latching the data signal DQ based on falling edges of the internal write data strobe signals dWDQS[0] to dWDQS[3].

As described above, before the write data strobe signal WDQS toggles, the memory device 200 may initialize the internal write data strobe signals dWDQS to reset values and may generate the internal write data strobe signals dWDQS having desired phases. As such, the memory device 200 may not separately perform the auto-synchronization for adjusting the phases of the internal write data strobe signals dWDQS. That is, auto-synchronization may be omitted. In the case where the auto-synchronization is not performed, additional toggling of the write data strobe signal WDQS for the auto-synchronization may not be required. That is, since a period where the write data strobe signal WDQS is maintained in a static state increases before the data D0 to D7 are transmitted, a toggling period may be shortened.

Figure 6:
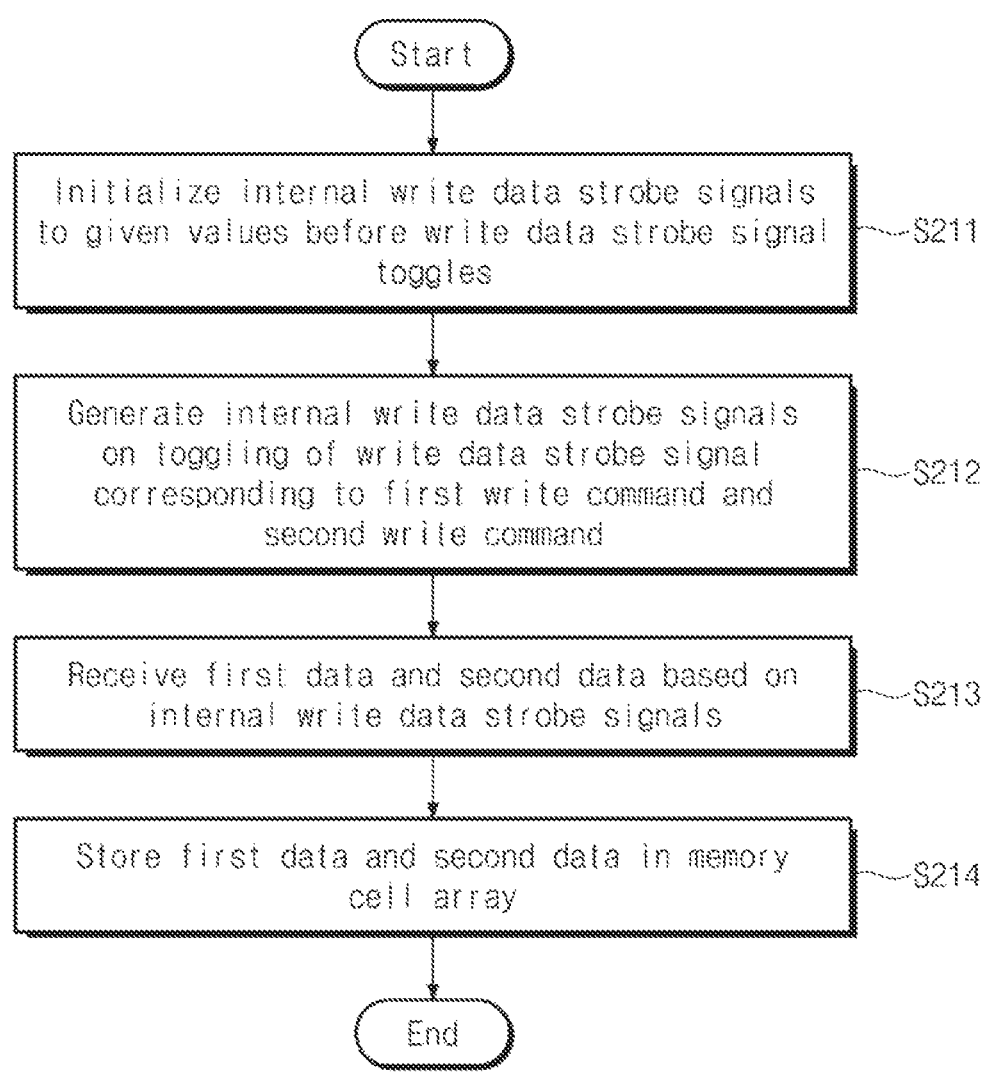
FIG. 6 is a flowchart illustrating an exemplary write operation of a memory device according to an embodiment.

FIG. 6 is a flowchart illustrating an exemplary write operation of a memory device according to an embodiment. Referring to FIGS. 2 and 6, in operation S211, before the write data strobe signal WDQS toggles, the memory device 200 may initialize the internal write data strobe signals dWDQS to given values.

In operation S212, the memory device 200 may generate the internal write data strobe signals dWDQS depending on toggling of the write data strobe signal WDQS corresponding to a first write command and a second write command. In an exemplary embodiment, without an additional reset operation, the memory device 200 may generate the write data strobe signal WDQS corresponding to the first write command and the second write command. For example, even though the toggling of the write data strobe signal WDQS is stopped between a first toggling period of the write data strobe signal WDQS according to the first write command and a second toggling period of the write data strobe signal WDQS according to the second write command, the memory device 200 may generate the internal write data strobe signals dWDQS without an additional reset operation.

In operation S213, the memory device 200 may receive first data and second data based on the internal write data strobe signals dWDQS thus generated. Here, the first data may correspond to the first write command, and the second data may correspond to the second write command. In operation S214, the memory device 200 may store the first data and the second data in the memory cell array 220.

Figure 7A:
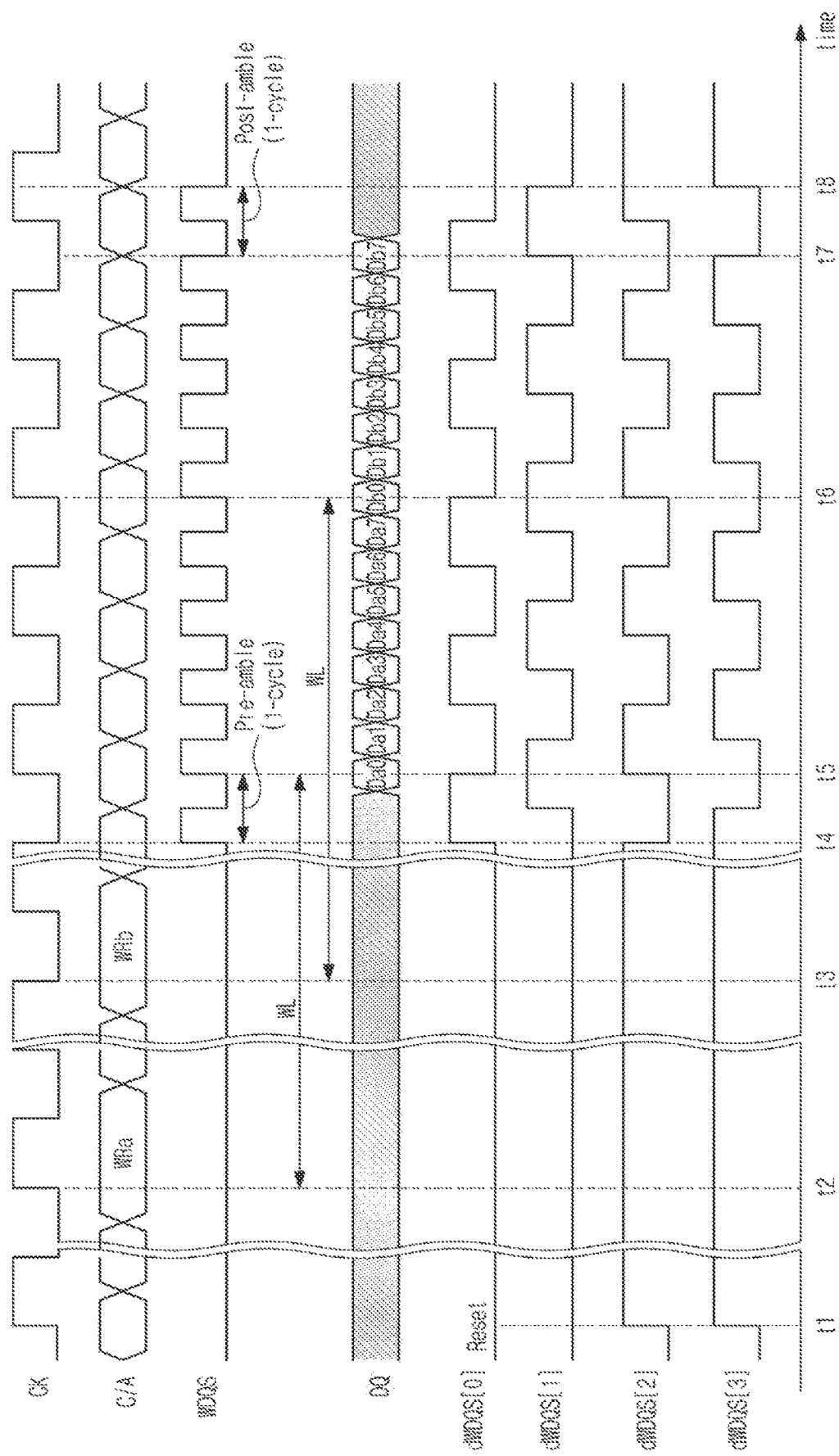
FIGS. 7A and 7B are timing diagrams illustrating examples of the write operation of FIG. 6.
Figure 7B:
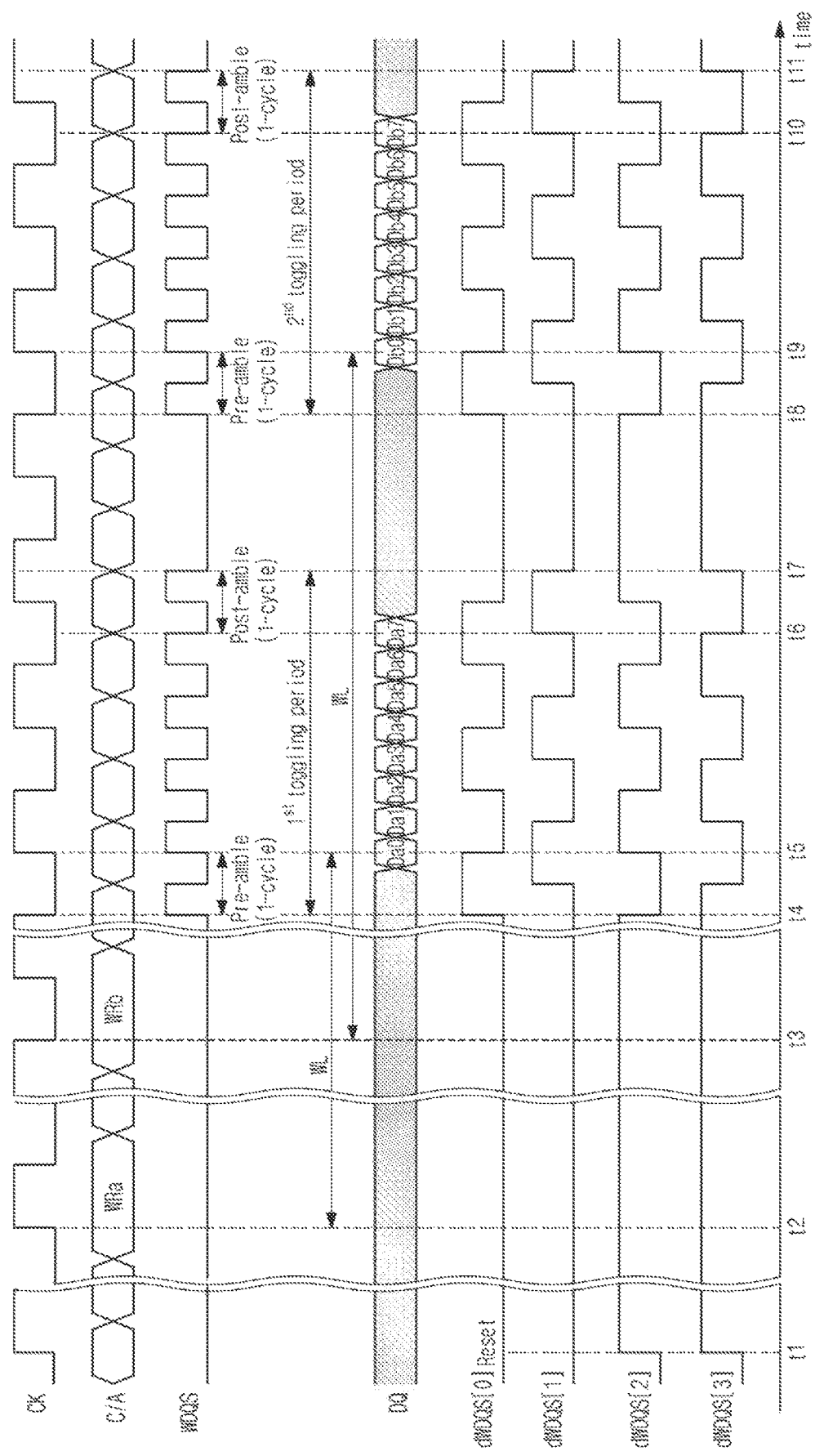

FIGS. 7A and 7B are timing diagrams illustrating examples of the write operation of FIG. 6. Referring to FIGS. 7A and 7B, the memory device 200 may receive the clock signal CK, the command/address signal C/A including a first write command WRa and a second write command WRb, the write data strobe signal WDQS, and the data signal DQ including first data Da0 to Da7 and second data Db0 to Db7. In detail, FIG. 7A is a timing diagram illustrating a write operation when an interval between the first write command WRa and the second write command WRb is equal to or lower than a reference time (i.e., when the first data Da0 to Da7 and the second data Db0 to Db7 are seamless). FIG. 7B is a timing diagram illustrating a write operation when an interval between the first write command WRa and the second write command WRb exceeds the reference time (i.e., when the first data Da0 to Da7 and the second data Db0 to Db7 are not seamless). Here, the reference time may be a transmission time of data corresponding to one write command. For example, as illustrated in FIGS. 7A and 7B, when a transmission time of data corresponding to one write command corresponds to two cycles of the clock signal CK, the reference time may correspond to two cycles of the clock signal CK.

Referring to FIGS. 2 and 7A, before the write data strobe signal WDQS toggles, that is, at the first time t1, the memory device 200 may initialize the first and second internal write data strobe signals dWDQS[0] and dWDQS[1] to the low level and may initialize the third and fourth internal write data strobe signals dWDQS[2] and dWDQS[3] to the high level.

Based on the clock signal CK, the memory device 200 may receive the first write command WRa at the second time t2 and may receive the second write command WRb at the third time t3. For example, in some embodiments, an interval between the first write command WRa and the second write command WRb may be equal to or less than two cycles of the clock signal CK.

The memory device 200 may receive the write data strobe signal WDQS that toggles from the fourth time t4 to an eighth time t8. In this case, the write data strobe signal WDQS may have one toggling period (i.e., from the fourth time t4 to the eighth time t8) corresponding to the first write command WRa and the second write command WRb. As such, the write data strobe signal WDQS may have one pre-amble and one post-amble with regard to both the first write command WRa and the second write command WRb, as illustrated in FIG. 7A.

The memory device 200 may generate the first internal write data strobe signal dWDQS[0] having an edge timing identical to an edge timing of the write data strobe signal WDQS at the fourth time t4 based on reset values of the internal write data strobe signals dWDQS[1] to dWDQS[3] and may generate the second to fourth internal write data strobe signals dWDQS[1] to dWDQS[3] that are respectively delayed with respect to the first internal write data strobe signal dWDQS[0] by phase differences of 90 degrees, 180 degrees, and 270 degrees, respectively. After the reset operation is performed at the first time t1, the memory device 200 may generate the internal write data strobe signals dWDQS[0] to dWDQS[3] without an additional reset operation.

At the fifth time t5 when a write latency WL elapses from the second time t2 when the first write command WRa is received, the memory device 200 may start to receive the data signal DQ including the first data Da0 to Da7. At the sixth time t6 when a write latency WL elapses from the third time t3 when the second write command WRb is received, the memory device 200 may start to receive the data signal DQ including the second data Db0 to Db7.

The memory device 200 may receive the first data Da0 to Da7 and the second data Db0 to Db7 by latching the data signal DQ based on the internal write data strobe signals dWDQS[0] to dWDQS[3]. For example, the memory device 200 may latch the data signal DQ at a falling edge of each of the internal write data strobe signals dWDQS[0] to dWDQS[3]. As such, from the fifth time t5 to the seventh time t7, the first data Da0 to Da7 and the second data Db0 to Db7 may be received from the data signal DQ.

Referring to FIGS. 2 and 7B, before the write data strobe signal WDQS toggles, that is, at the first time t1, the memory device 200 may initialize the first and second internal write data strobe signals dWDQS[0] and dWDQS[1] to the low level and may initialize the third and fourth internal write data strobe signals dWDQS[2] and dWDQS[3] to the high level.

Based on the clock signal CK, the memory device 200 may receive the first write command WRa at the second time t2 and may receive the second write command WRb at the third time t3. For example, an interval between the first write command WRa and the second write command WRb may exceed two cycles of the clock signal CK.

The memory device 200 may receive the write data strobe signal WDQS including toggling periods respectively corresponding to the first and second write commands WRa and WRb. The write data strobe signal WDQS may have a first ($1^{st}$) toggling period (i.e., from the fourth time t4 to the seventh time t7) corresponding to the first write command WRa and a second ($2^{nd}$) toggling period (i.e., from the eighth time t8 to the eleventh time t11) corresponding to the second write command WRb. That is, the toggling of the write data strobe signal WDQS may be stopped between the first toggling period and the second toggling period (i.e., from the seventh time t7 to the eighth time t8). As such, the write data strobe signal WDQS may have one pre-amble and one post-amble for each of the first toggling and the second toggling, as illustrated in FIG. 7B.

The memory device 200 may generate the internal write data strobe signals dWDQS[0] to dWDQS[3] toggling from the fourth time t4 to the seventh time t7 with regard to the first toggling and may generate the internal write data strobe signals dWDQS[0] to dWDQS[3] toggling from the eighth time t8 to the eleventh time t11 with regard to the second toggling. After the reset operation is performed at the first time t1, the memory device 200 may generate the internal write data strobe signals dWDQS[0] to dWDQS[3] without an additional reset operation.

The toggling of the internal write data strobe signals dWDQS[0] to dWDQS[3] may be stopped from the seventh time t7 to the eighth time t8. While the toggling is stopped, the internal write data strobe signals dWDQS[1] to dWDQS[3] may maintain the same values as at the first time t1. As such, the internal write data strobe signals dWDQS[1] to dWDQS[3] toggling with regard to the second toggling may have desired phases (i.e., phases of the internal write data strobe signals dWDQS[1] to dWDQS[3] toggling with regard to the first toggling).

At the fifth time t5 when a write latency WL elapses from the second time t2 when the first write command WRa is received, the memory device 200 may start to receive the data signal DQ including the first data Da0 to Da7. At the ninth time t9 when a write latency WL elapses from the third time t3 when the second write command WRb is received, the memory device 200 may start to receive the data signal DQ including the second data Db0 to Db7.

The memory device 200 may receive the first data Da0 to Da7 and the second data Db0 to Db7 by latching the data signal DQ based on the internal write data strobe signals dWDQS[0] to dWDQS[3]. For example, the memory device 200 may latch the data signal DQ at a falling edge of each of the internal write data strobe signals dWDQS[0] to dWDQS[3]. As such, from the fifth time t5 to the eleventh time t11, the first data Da0 to Da7 and the second data Db0 to Db7 may be received from the data signal DQ.

As described with reference to FIGS. 7A and 7B, in the case where the internal write data strobe signals dWDQS are initialized to reset values before the write data strobe signal WDQS starts to toggle, the memory device 200 may generate the internal write data strobe signals dWDQS having desired phases without an additional reset operation and may receive write data corresponding to a plurality of write commands. As such, power consumption of the memory device 200 may be reduced.

A write operation according to a plurality of write commands is described with reference to FIGS. 6, 7A, and 7B, but embodiments are not limited thereto. For example, in a read operation according to a plurality of read commands, the memory device 200 may generate the internal write data strobe signals dWDQS without performing an additional reset operation. Alternatively, in a write operation according to a write command and a read operation according to a read command, the memory device 200 may generate the internal write data strobe signals dWDQS without performing an additional reset operation.

Figure 8:
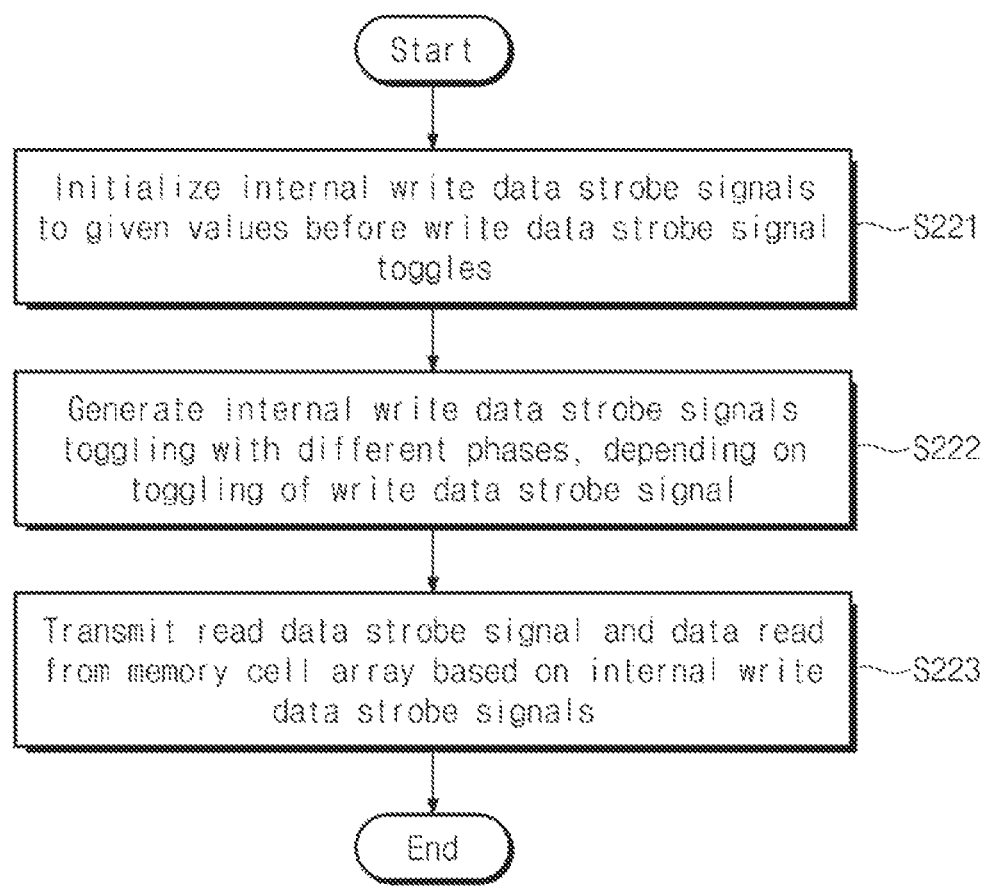
FIG. 8 is a flowchart illustrating an exemplary read operation of a memory device according to an embodiment.

FIG. 8 is a flowchart illustrating an exemplary read operation of a memory device according to an embodiment. Referring to FIGS. 2 and 8, in operation S221, before the write data strobe signal WDQS toggles, the memory device 200 may initialize the internal write data strobe signals dWDQS to given values. As such, the internal write data strobe signals dWDQS may be maintained at the reset values before toggle.

In operation S222, the memory device 200 may generate the internal write data strobe signals dWDQS toggling with different phases, depending on toggling of the write data strobe signal WDQS. Since the internal write data strobe signals dWDQS are maintained at the reset values before toggle, the memory device 200 may generate the internal write data strobe signals dWDQS having desired phases.

In operation S223, the memory device 200 may transmit the read data strobe signal RDQS and the data "DATA" read from the memory cell array 220 to the memory controller 100 based on the internal write data strobe signals dWDQS.

Figure 9:
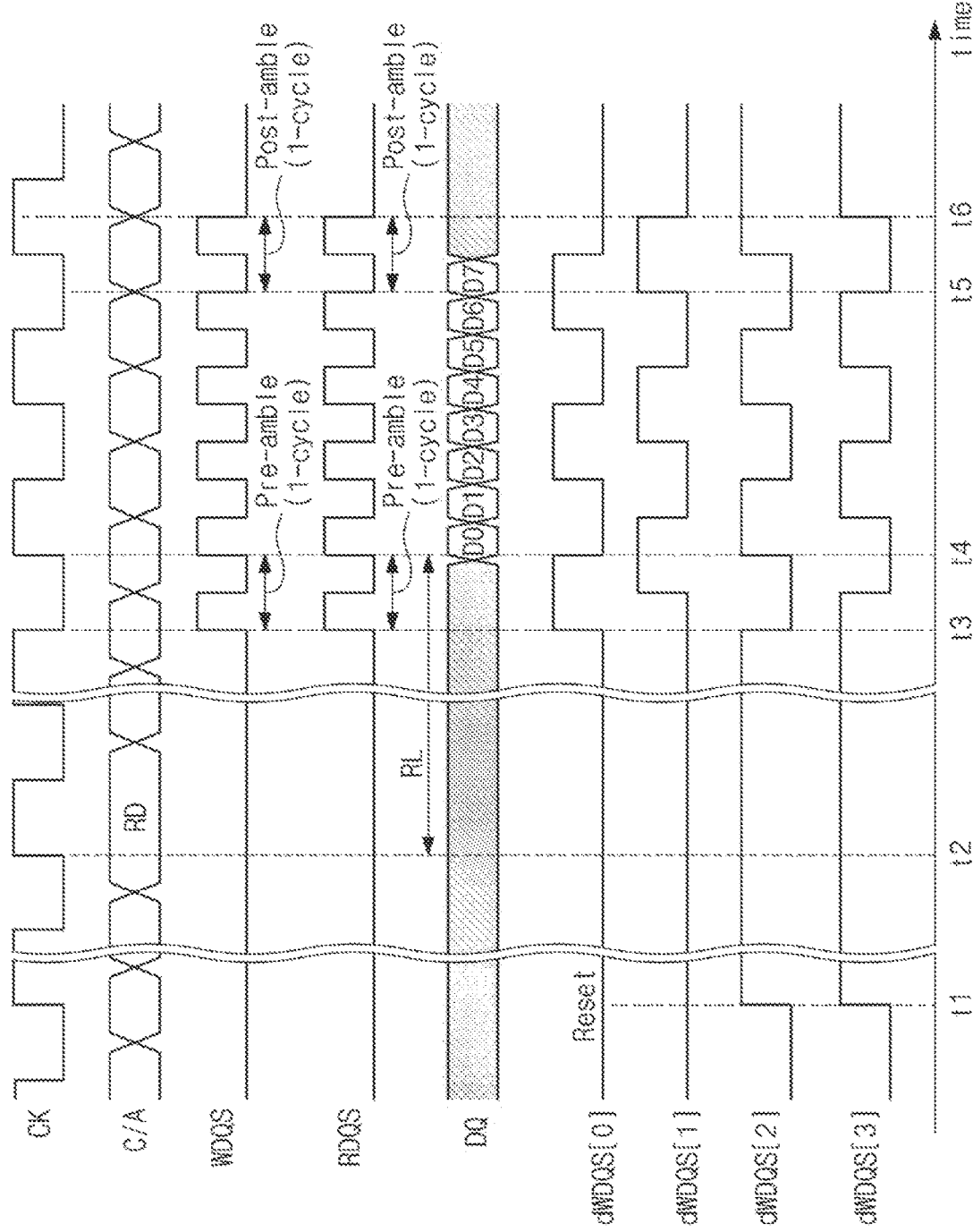
FIG. 9 is a timing diagram illustrating an example of the read operation of FIG. 8.

FIG. 9 is a timing diagram illustrating an example of a read operation of FIG. 8. Referring to FIGS. 2 and 9, the memory device 200 may receive the clock signal CK, the command/address signal C/A including the read command RD, and the write data strobe signal WDQS. The memory device 200 may transmit the data signal DQ including the read data strobe signal RDQS and the data D0 to D7 to the memory controller 100 in response to the memory controller 100 (refer to FIG. 1).

At the first time t1, the memory device 200 may initialize the internal write data strobe signals dWDQS[0] to dWDQS[3] to reset values. The memory device 200 may initialize the first and second internal write data strobe signals dWDQS[0] and dWDQS[1] to the low level and may initialize the third and fourth internal write data strobe signals dWDQS[2] and dWDQS[3] to the high level.

The memory device 200 may receive the command/address signal C/A including the read command RD at the second time t2. The memory device 200 may receive the read command RD by latching the command/address signal C/A based on a rising edge and a falling edge of the clock signal CK. An example is illustrated in FIG. 9 as the read command RD is received during two cycles of the command/address signal C/A, but embodiments are not limited thereto.

The memory device 200 may receive the write data strobe signal WDQS that toggles from the third time t3 to the sixth time t6. While the write data strobe signal WDQS toggles, the write data strobe signal WDQS may include one pre-amble cycle and one post-amble cycle.

At the third time t3, the memory device 200 may generate the first internal write data strobe signal dWDQS[0] having an edge timing identical to an edge timing of the write data strobe signal WDQS. The memory device 200 may generate the second to fourth internal write data strobe signals dWDQS[1] to dWDQS[3] that are respectively delayed with respect to the first internal write data strobe signal dWDQS[0] by phase differences of 90 degrees, 180 degrees, and 270 degrees.

The memory device 200 may generate the read data strobe signal RDQS toggling from the third time t3 to the sixth time t6 based on the internal write data strobe signals dWDQS[0] to dWDQS[3]. While the read data strobe signal RDQS toggles, the read data strobe signal RDQS may include one pre-amble cycle and one post-amble cycle. An example is illustrated in FIG. 9 in which a time to start to receive the write data strobe signal WDQS toggling and a time to start to transmit the read data strobe signal RDQS toggling are identical, that is, both correspond to the third time t3, but a delay may be present between the time to start to receive the write data strobe signal WDQS toggling and the time to start to transmit the read data strobe signal RDQS toggling. Below, for convenience of description, it is assumed that the time to start to receive the write data strobe signal WDQS that toggles and the time to start to transmit the read data strobe signal RDQS that toggles are identical.

The memory device 200 may generate the data signal DQ including the data D0 to D7 from the fourth time t4 to the fifth time t5 based on the internal write data strobe signals dWDQS[0] to dWDQS[3]. At the fourth time t4 when a read latency RL elapses from the second time t2 when the read command RD is received, the memory device 200 may start to transmit the data signal DQ including the data D0 to D7. As such, the data D0 to D7 may be aligned with toggle timings of the read data strobe signal RDQS and may be transmitted to the memory controller 100.

Since the toggling of the write data strobe signal WDQS is stopped at the sixth time t6, the toggling of the internal write data strobe signals dWDQS[0] to dWDQS[3] may be stopped. In this case, each of the internal write data strobe signals dWDQS[0] to dWDQS[3] may have the same value as at the first time t1. That is, after the sixth time t6, each of the internal write data strobe signals dWDQS[0] to dWDQS[3] may maintain the reset value. As such, as described with reference to FIGS. 7A and 7B, the memory device 200 may generate the internal write data strobe signals dWDQS[0] to dWDQS[3] having desired phases without an additional reset operation and may perform the following write and read operations. An example of a read operation has been described with respect to FIGS. 8 and 9. However, one of ordinary skill in the art will understand that the technical concepts of the write operations described above with respect to the timing diagrams of FIGS. 5B, 7A and 7B also may be applied to a read operation. Hence, repeated description thereof is omitted for conciseness.

Figure 10A:
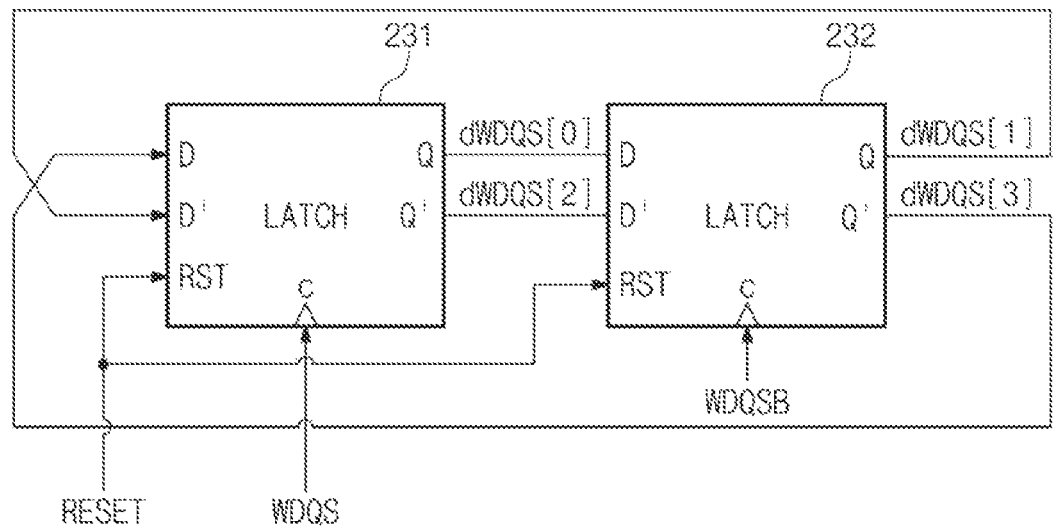
FIGS. 10A and 10B are block diagrams illustrating write data strobe signal (WDQS) dividers according to various embodiments.
Figure 10B:
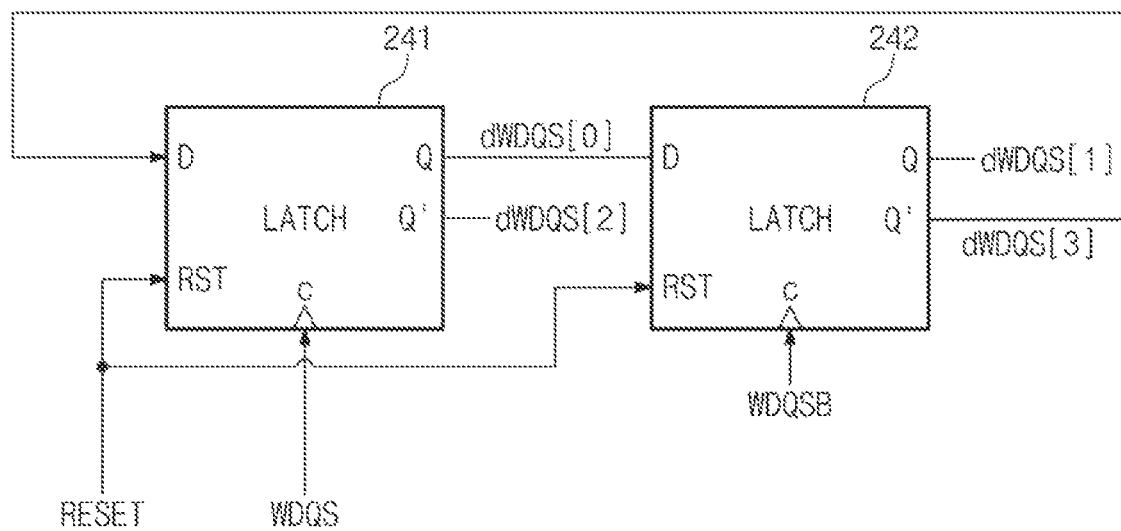

FIGS. 10A and 10B are block diagrams illustrating WDQS dividers according to various embodiments. For example, the WDQS divider 213 of the memory device 200 of FIG. 2 may be implemented with a WDQS divider 230 illustrated in FIG. 10A or a WDQS divider 240 illustrated in FIG. 10B. Each of the WDQS dividers 230 and 240 may generate the four internal write data strobe signals dWDQS[0] to dWDQS[3] based on the write data strobe signal WDQS, as described with reference to FIG. 5A.

Referring to FIG. 10A, the WDQS divider 230 may include a first latch 231 and a second latch 232. Each of the first and second latches 231 and 232 may include a first input terminal "D", a second input terminal D', a first output terminal "Q", a second output terminal Q', a reset terminal RST, and a clock terminal "C". Each of the first and second latches 231 and 232 may receive complementary inputs through the first input terminal "D" and the second input terminal D' and may output complementary values through the first output terminal "Q" and the second output terminal Q'.

The first input terminal "D" of the first latch 231 may be connected with the second output terminal Q' of the second latch 232, and the second input terminal D' of the first latch 231 may be connected with the first output terminal "Q" of the second latch 232. The first output terminal "Q" of the first latch 231 may be connected with the first input terminal "D" of the second latch 232, and the second output terminal Q' of the first latch 231 may be connected with the second input terminal D' of the second latch 232.

The reset signal RESET may be input to the reset terminal RST of each of the first and second latches 231 and 232. The first and second latches 231 and 232 may be reset by the reset signal RESET. For example, as described with reference to FIGS. 5A and 5B, each of the first and second latches 231 and 232 may be initialized to the low level or the high level depending on the number of pre-amble cycles of the write data strobe signal WDQS. When each of the first and second latches 231 and 232 is reset, each of the first and second latches 231 and 232 may output a reset value through the first output terminal "Q" and may output a complementary value through the second output terminal Q'.

The write data strobe signal WDQS may be input to the clock terminal "C" of the first latch 231, and a complementary write data strobe signal WDQSB may be input to the clock terminal "C" of the second latch 232. The write data strobe signal WDQS and the complementary write data strobe signal WDQSB may be respectively input to the clock terminals "C" of the first and second latches 231 and 232. In this case, the write data strobe signal WDQS and the complementary write data strobe signal WDQSB may be provided from the memory controller 100 as differential signals. The first latch 231 may output values input to the input terminals "D" and D' to the output terminals "Q" and Q' based on a rising edge of the write data strobe signal WDQS. The second latch 232 may output values input to the input terminals "D" and D' to the output terminals "Q" and Q' based on a rising edge of the complementary write data strobe signal WDQSB.

The first internal write data strobe signal dWDQS[0] may be output from the first output terminal "Q" of the first latch 231, and the third internal write data strobe signal dWDQS[2] may be output from the second output terminal Q' of the first latch 231. The second internal write data strobe signal dWDQS[1] may be output from the first output terminal "Q" of the second latch 232, and the fourth internal write data strobe signal dWDQS[3] may be output from the second output terminal Q' of the second latch 232.

Referring to FIGS. 5A and 10A, when the reset signal RESET is input before the write data strobe signal WDQS toggles, depending on the reset signal RESET, the WDQS divider 230 may output the first and second internal write data strobe signals dWDQS[0] and dWDQS[1] having the low level through the first output terminals "Q" and may output the third and fourth internal write data strobe signals dWDQS[2] and dWDQS[3] having the high level through the second output terminals Q'. While the write data strobe signal WDQS toggles, the WDQS divider 230 may output the internal write data strobe signals dWDQS[0] to dWDQS[3] toggling based on a rising edge of the write data strobe signal WDQS and a rising edge of the complementary write data strobe signal WDQSB.

Referring to FIG. 10B, the WDQS divider 240 may include a first latch 241 and a second latch 242. Each of the first and second latches 241 and 242 may include an input terminal "D", a first output terminal "Q", a second output terminal Q', a reset terminal RST, and a clock terminal "C". Each of the first and second latches 241 and 242 may output complementary values through the first output terminal "Q" and the second output terminal Q'. The input terminal "D" of the first latch 241 may be connected with the second output terminal Q' of the second latch 242. The first output terminal "Q" of the first latch 241 may be connected with the input terminal "D" of the second latch 242.

The first internal write data strobe signal dWDQS[0] may be output from the first output terminal "Q" of the first latch 241, and the third internal write data strobe signal dWDQS[2] may be output from the second output terminal Q' of the first latch 241. The second internal write data strobe signal dWDQS[1] may be output from the first output terminal "Q" of the second latch 242, and the fourth internal write data strobe signal dWDQS[3] may be output from the second output terminal Q' of the second latch 242. As such, an operation of the WDQS divider 240 may be substantially identical to the operation of the WDQS divider 230 of FIG. 10A, and thus, additional description will be omitted to avoid redundancy.

Figure 11:
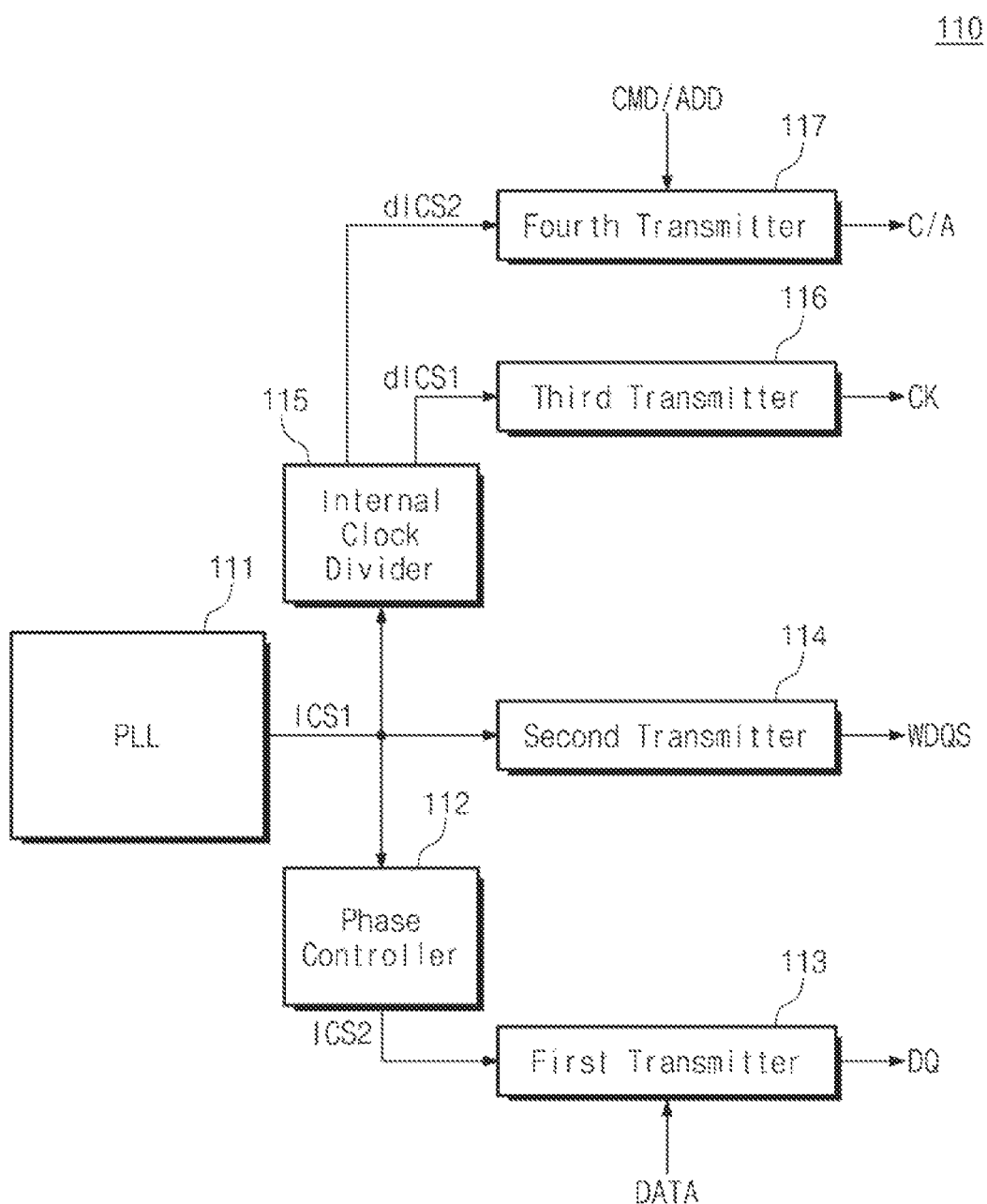
FIG. 11 is an exemplary block diagram illustrating a memory interface of the memory system of FIG. 1, according to an embodiment.

FIG. 11 is an exemplary block diagram illustrating a memory interface of the memory system 10 of FIG. 1. Referring to FIG. 11, the memory interface (I/F) 110 may include a phase locked loop 111, a phase controller 112, a first transmitter 113, a second transmitter 114, an internal clock divider 115, a third transmitter 116, and a fourth transmitter 117. The phase locked loop 111 may generate a first internal clock signal ICS1. The phase controller 112 may generate a second internal clock signal ICS2 having a phase different from a phase of the first internal clock signal ICS1, based on the first internal clock signal ICS1. For example, the first internal clock signal ICS1 and the second internal clock signal ICS2 may be 90 degrees out of phase.

The first transmitter 113 may transmit the data "DATA" based on the second internal clock signal ICS2. As such, the first transmitter 113 may transmit the data signal DQ including the data "DATA" to the memory device 200. The second transmitter 114 may transmit the first internal clock signal ICS1 as the write data strobe signal WDQS to the memory device 200.

The internal clock divider 115 may divide the first internal clock signal ICS1 to generate first and second divided internal clock signals dICS1 and dICS2 having different phases. An edge timing of the first divided internal clock signal dICS1 may be identical to an edge timing of the first internal clock signal ICS1, and the first divided internal clock signal dICS1 and the second divided internal clock signal dICS2 may be 270 degrees out of phase. For example, a frequency of the divided internal clock signals dICS1 and dICS2 may be half the frequency of the second internal clock signal ICS2.

The third transmitter 116 may transmit the first divided internal clock signal dICS1 as the clock signal CK to the memory device 200. Because the edge timing of the first divided internal clock signal dICS1 is identical to the edge timing of the second internal clock signal ICS2, the clock signal CK and the write data strobe signal WDQS may be output with the same edge timing. The fourth transmitter 117 may transmit the command CMD and/or an address ADD based on the second divided internal clock signal dICS2. As such, the fourth transmitter 117 may transmit the command/ address signal C/A including the command CMD and/or the address ADD to the memory device 200.

As described above, the clock signal CK and the write data strobe signal WDQS may be generated through one phase locked loop 111. As such, an operating current of the memory controller 100 may be reduced.

Figure 12:
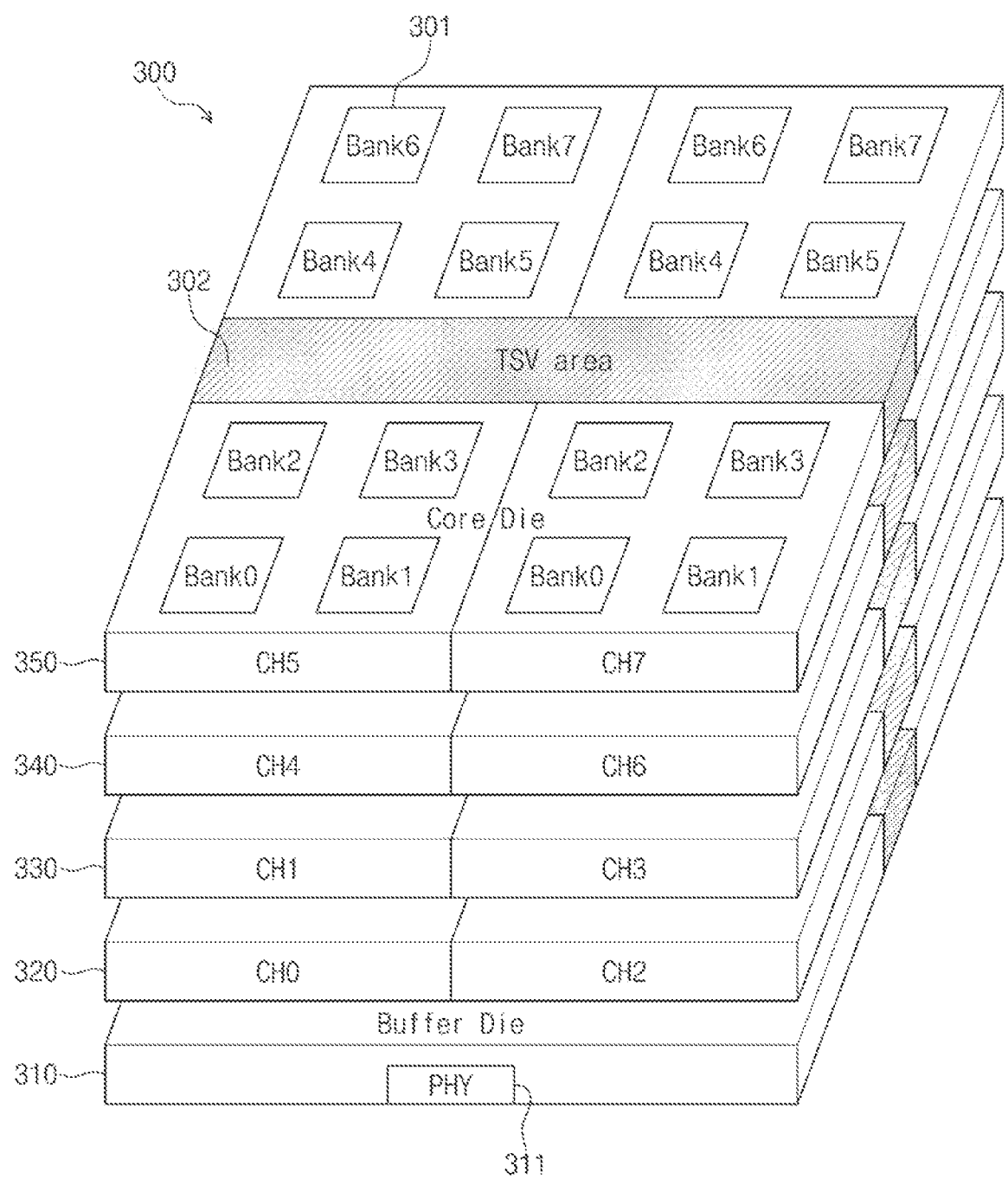
FIG. 12 is a block diagram illustrating a stacked memory device according to various embodiments.

FIG. 12 is a block diagram illustrating a stacked memory device according to various embodiments. Referring to FIG. 12, a stacked memory device 300 may include a buffer die 310 and a plurality of core dies 320 to 350. For example, the buffer die 310 may be also referred to as an "interface die", a "base die", a "logic die", or a "master die", and each of the core dies 320 to 350 may be also referred to as a "memory die" or a "slave die". An example is illustrated in FIG. 12 as the stacked memory device 300 includes the four core dies 320 to 350, but the number of core dies may be variously changed. For example, the stacked memory device 300 may include 8, 12, or 16 core dies.

The buffer die 310 and the core dies 320 to 350 may be stacked and may be electrically connected by using through silicon vias (TSV). As such, the stacked memory device 300 may have a three-dimensional memory structure in which the plurality of dies 310 to 350 are stacked. For example, the stacked memory device 300 may be implemented in compliance with the HBM or HMC standard.

The stacked memory device 300 may support a plurality of channels (or vaults) that are functionally independent of each other. For example, as illustrated in FIG. 12, the stacked memory device 300 may support 8 channels CH0 to CH7. In the case where each of the channels CH0 to CH7 supports 128 DQ I/Os, the stacked memory device 300 may support 1204 DQ I/Os. However, embodiments are not limited thereto. For example, the stacked memory device 300 may support 1024 or more DQ I/Os and may support 8 or more channels (e.g., 16 channels). In the case where the stacked memory device 300 supports 16 channels, each of the channels may support 64 DQ I/Os.

Each of the core dies 320 to 350 may support at least one channel. For example, as illustrated in FIG. 12, the core dies 320 to 350 may support channel pairs CH0 and CH2, CH1 and CH3, CH4 and CH6, and CH5 and CH7, respectively. In this case, the core dies 320 to 350 may support different channels. However, embodiments are not limited thereto. For example, at least two of the core dies 320 to 350 may support the same channel. For example, each of the core dies 320 to 350 may support the first channel CH0.

Each of channels may form an independent command and data interface. For example, channels may be independently clocked based on independent timing requirements and may not be synchronized. For example, based on an independent command, each channel may change a power state or may perform a refresh operation.

Each of the channels may include a plurality of memory banks 301. Each of the memory banks 301 may include memory cells connected with word lines and bit lines, a row decoder, a column decoder, a sense amplifier, etc. For example, as illustrated in FIG. 12, each of the channels CH0 to CH7 may support 8 memory banks 301. However, embodiments are not limited thereto. For example, each of the channels CH0 to CH7 may support 8 or more memory banks 301. An example is illustrated in FIG. 12 as memory banks belonging to one channel are included in one core die, but memory banks belonging to one channel may be distributed into a plurality of core dies. For example, in the case where each of the core dies 320 to 350 supports the first channel CH0, memory banks included in the first channel CH0 may be distributed into the core dies 320 to 350.

In an exemplary embodiment, one channel may be divided into two pseudo channels that operate independently of each other. For example, the pseudo channels may share a command and clock inputs (e.g., a clock signal CK and a clock enable signal CKE) of the corresponding channel but may independently decode and execute commands. For example, in the case where one channel supports 128 DQ I/Os, each of the pseudo channels may support 64 DQ I/Os. For example, in the case where one channel supports 64 DQ I/Os, each of the pseudo channels may support 32 DQ I/Os.

The buffer die 310 and the core dies 320 to 350 each may include a TSV area 302. TSVs configured to penetrate the dies 310 to 350 may be disposed in the TSV area 302. The buffer die 310 may exchange signals and/or data with the core dies 320 to 350 through the TSVs. Each of the core dies 320 to 350 may exchange signals and/or data with the buffer die 310 through the TSVs, and the core dies 320 to 350 may exchange signals and/or data with each other through the TSVs. In this case, the signals and/or data may be independently exchanged through the corresponding TSVs for each channel. For example, in the case where an external host device transmits a command and an address to the first channel CH0 for the purpose of accessing a memory cell of the first core die 320, the buffer die 310 may transmit control signals to the first core die 320 through TSVs corresponding to the first channel CH0 and may access the memory cell of the first channel CH0.

The buffer die 310 may include a physical layer (PHY) 311. The physical layer 311 may include interface circuits for communication with the external host device. For example, the physical layer 311 may include interface circuits corresponding to the host interface 210 described with reference to FIGS. 1 to 11. Signals and/or data received through the physical layer 311 may be transferred to the core dies 320 to 350 through the TSVs.

In an exemplary embodiment, the buffer die 310 may include channel controllers respectively corresponding to channels. A channel controller may manage memory reference operations of the corresponding channel and may determine a timing requirement of the corresponding channel.

In an exemplary embodiment, the buffer die 310 may include a plurality of pins for receiving signals from the external host device. Through the plurality of pins, the buffer die 310 may receive the clock signal CK, the command/address signal C/A, the write data strobe signal WDQS, and the data signal DQ and may transmit the read data strobe signal RDQS and the data signal DQ. For example, the buffer die 310 may include 2 pins for receiving the clock signal CK, 14 pins for receiving the command/address signal C/A, 8 pins for receiving the write data strobe signal WDQS, 8 pins for transmitting the read data strobe signal RDQS, and 128 pins for transmitting and receiving the data signal DQ, for each channel.

Figure 13:
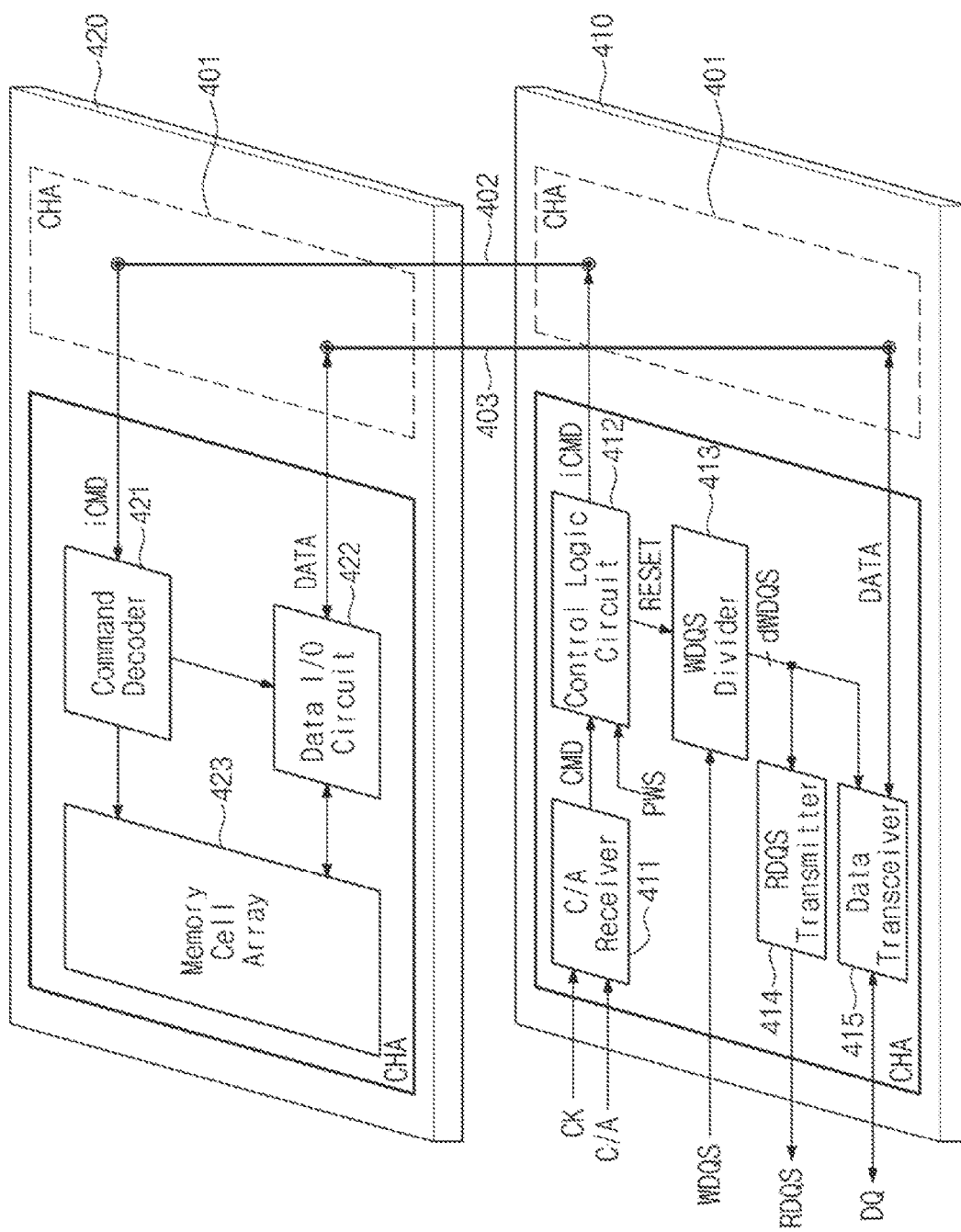
FIG. 13 is an exemplary more detailed block diagram illustrating the stacked memory device of FIG. 12, according to an embodiment.

FIG. 13 is an exemplary more detailed block diagram illustrating the stacked memory device of FIG. 12, according to an embodiment. Referring to FIG. 13, a stacked memory device 400 may include a buffer die 410 and a core die 420. The core die 420 may support a channel CHa of a plurality of channels. The buffer die 410 and the core die 420 may communicate with each other through TSVs 402 and 403 placed in a TSV area 401. The TSV area 401 may correspond to the channel CHa. For example, the buffer die 410 may transmit an internal command iCMD to the core die 420 through the TSV 402 and may exchange the data "DATA" with the core die 420 through the TSV 403.

The buffer die 410 may include a C/A receiver 411, a control logic circuit 412, a WDQS divider 413, an RDQS transmitter 414, and a data transceiver 415. The C/A receiver 411, the control logic circuit 412, the WDQS divider 413, the RDQS transmitter 414, and the data transceiver 415 may be included in the physical layer 311 of the stacked memory device 300 of FIG. 12 as interface circuits of the channel CHa. That is, the physical layer 311 of FIG. 12 may include the interface circuits illustrated in FIG. 13 for each channel. The C/A receiver 411, the control logic circuit 412, the WDQS divider 413, the RDQS transmitter 414, and the data transceiver 415 may respectively correspond to the C/A receiver 211, the control logic circuit 212, the WDQS divider 213, the RDQS transmitter 214, and the data transceiver 215 of FIG. 2, and thus, additional description will be omitted to avoid redundancy.

The buffer die 410 may receive the clock signal CK, the command/address signal C/A, the write data strobe signal WDQS, and the data signal DQ that are provided through the channel CHa. The buffer die 410 may transmit the read data strobe signal RDQS and the data signal DQ generated at the channel CHa to the external host device.

The C/A receiver 411 may receive the command CMD by latching the command/address signal C/A based on the clock signal CK. The received command CMD may be provided to the control logic circuit 412.

Depending on the command CMD or the power state information PWS, the control logic circuit 412 may generate the reset signal RESET before the write data strobe signal WDQS starts to toggle. The control logic circuit 412 may decode the command CMD and may generate the internal command iCMD depending on the command CMD. For example, the internal command iCMD may be generated in a format different from that of the command CMD in compliance with an internal communication protocol between the buffer die 410 and the core die 420 or may be generated in a format identical to that of the command CMD. The internal command iCMD may be transmitted through the TSV 402 to the core die 420 supporting the channel CHa.

The WDQS divider 413 may be reset in response to the reset signal RESET. As such, the WDQS divider 413 may initialize the internal write data strobe signals dWDQS to a reset value(s). The WDQS divider 413 may generate the internal write data strobe signals dWDQS toggling with different phases depending on the toggling of the write data strobe signal WDQS.

In an exemplary embodiment, the stacked memory device 400 may transmit or receive the write data strobe signal WDQS without a separate termination resistor. In other words, a separate termination resistor may be omitted. In this case, the write data strobe signal WDQS may be in a static low state or a static high state, not a high-impedance state High-Z. As such, the reset operation of the WDQS divider 413 may be easily performed.

The RDQS transmitter 414 may generate the read data strobe signal RDQS based on the internal write data strobe signals dWDQS and may transmit the read data strobe signal RDQS to the external host device. The read data strobe signal RDQS may be generated to have a frequency identical to a frequency of the write data strobe signal WDQS.

The data transceiver 415 may transmit and receive the data signal DQ including the data "DATA" based on the internal write data strobe signals dWDQS. In the write operation, the data transceiver 415 may receive the data "DATA" by latching the data signal DQ based on the internal write data strobe signals dWDQS. The received data "DATA" may be transmitted through the TSV 403 to the core die 420 supporting the channel CHa. In the read operation, the data transceiver 415 may receive the data "DATA" transmitted from the core die 420 through the TSV 403. The data transceiver 415 may transmit the data signal DQ including the data "DATA" to the external host device based on the internal write data strobe signals dWDQS. The data "DATA" may be aligned with toggle timings of the read data strobe signal RDQS and may be transmitted.

The core die 420 may include a command decoder 421, a data input/output (I/O) circuit 422, and a memory cell array 423. The command decoder 421, the data input/output circuit 422, and the memory cell array 423 may be circuits supporting the channel CHa.

The command decoder 421 may decode the internal command iCMD transmitted from the buffer die 410 through the TSV 402. For example, the internal command iCMD may include an active command, a write command, a read command, a refresh command, etc., which are associated with the memory cell array 220. In the write operation, the command decoder 421 may receive the internal command iCMD including the write command. In the read operation, the command decoder 421 may receive the internal command iCMD including the read command. The command decoder 421 may control the data input/output circuit 422 and the memory cell array 423 depending on the internal command iCMD.

The data input/output circuit 422 may exchange data with the buffer die 410 through the TSV 403. In the write operation, the data input/output circuit 422 may receive the data "DATA" transmitted from the buffer die 410 through the TSV 403 and may transmit the data "DATA" to the memory cell array 423. The memory cell array 423 may store the data "DATA". In the read operation, the data input/output circuit 422 may read the data "DATA" from the memory cell array 423 and may transmit the received data "DATA" to the buffer die 410 through the TSV 403.

In an exemplary embodiment, the buffer die 410 may further include an error correction code (ECC) circuit (not shown) for detecting and correcting an error of the data "DATA". For example, in the write operation, the ECC circuit may generate error detection bits (e.g., parity bits) for the data "DATA" received through the data transceiver 415. In the read operation, the ECC circuit may detect and correct an error of the data "DATA" transferred from the core die 420 by using the error detection bits and may transfer error-corrected data "DATA" to the data transceiver 215.

As described above, before the write data strobe signal WDQS starts to toggle, the stacked memory device 400 may initialize the internal write data strobe signals dWDQS to reset values. In this case, the internal write data strobe signals dWDQS that are generated as the write data strobe signal WDQS toggles may have desired phases. As such, the stacked memory device 400 may adjust phases of the internal write data strobe signals dWDQS without performing separate auto-synchronization. The stacked memory device 400 may transmit and receive the data "DATA" based on the internal write data strobe signals dWDQS having the desired phases.

Figure 14:
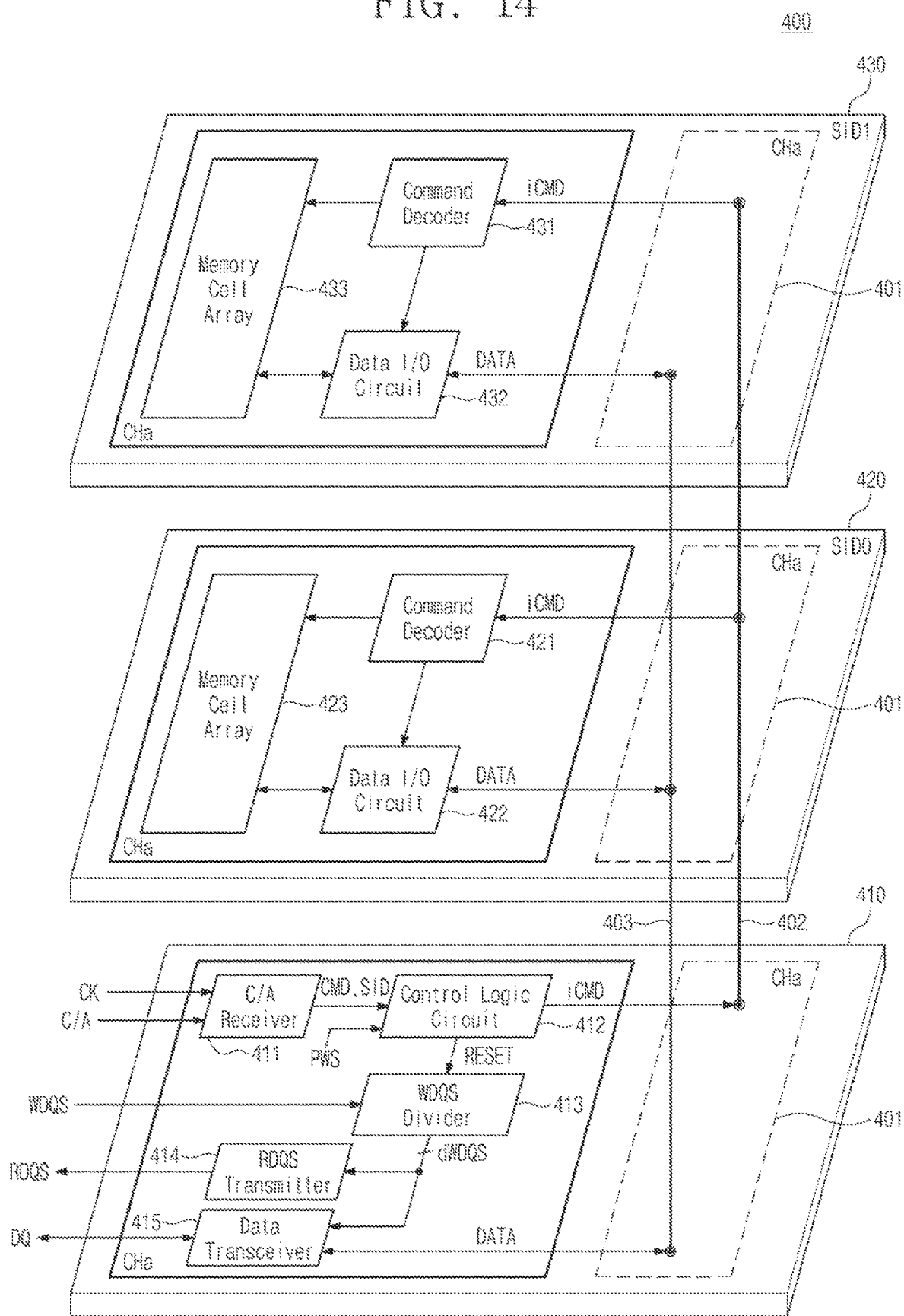
FIG. 14 is an exemplary more detailed block diagram illustrating the stacked memory device of FIG. 12, according to an embodiment.

FIG. 14 is an exemplary more detailed block diagram illustrating the stacked memory device of FIG. 12, according to an embodiment. Referring to FIG. 14, the stacked memory device 400 may include the buffer die 410, the core die 420 (hereinafter "a first core die 420" in relation to the embodiment of FIG. 14), and a second core die 430. The first core die 420 and the second core die 430 may support the same channel CHa of a plurality of channels. In this case, the first and second core dies 420 to 430 may be distinguishable by using a stack identifier SID. For example, the first core die 420 may correspond to a first stack identifier SID0, and the second core die 430 may correspond to a second stack identifier SID1. An example is illustrated in FIG. 14 in which any other core die does not exist between the first core die 420 and the second core die 430, but any other core die may be interposed between the first core die 420 and the second core die 430.

The buffer die 410 and the first and second core dies 420 and 430 may communicate with each other through the TSVs 402 and 403 placed in the TSV area 401. For example, the buffer die 410 may transmit the internal command iCMD to the first core die 420 and/or the second core die 430 through the TSV 402 and may exchange the data "DATA" with the first core die 420 and/or the second core die 430 through the TSV 403. An example is illustrated in FIG. 14 in which the buffer die 410 communicates with the first and second core dies 420 and 430 by using the same TSVs 402 and 403, but the buffer die 410 may communicate by using separate TSVs respectively corresponding to the first and second core dies 420 and 430.

The second core die 430 may include a command decoder 431, a data input/output (I/O) circuit 432, and a memory cell array 433. Operations of the command decoder 431, the data input/output circuit 432, and the memory cell array 433 may be substantially identical to the operations of the command decoder 421, the data input/output circuit 422, and the memory cell array 423 of the core die 420, as described with reference to FIG. 13, and therefore repeated description thereof is omitted for conciseness.

The C/A receiver 411 may receive the command CMD and the stack identifier SID by latching the command/address signal C/A based on the clock signal CK. The stack identifier SID may be an address indicating at least one core die for the purpose of distinguishing core dies supporting the same channel. The received command CMD and the stack identifier SID may be provided to the control logic circuit 412.

The control logic circuit 412 may transmit the internal command iCMD to at least one of the first core die 420 and the second core die 430, based on the stack identifier SID. For example, in the case where the stack identifier SID indicates the first stack identifier SID0, the control logic circuit 412 may transmit the internal command iCMD to the first core die 420.

In an exemplary embodiment, as illustrated in FIG. 14, in the case where the internal command iCMD and the data "DATA" are transferred to the first and second core dies 420 and 430 through the common TSVs 402 and 403, the buffer die 410 may transfer the stack identifier SID to the first and second core dies 420 and 430. The first and second core dies 420 and 430 may decode the transferred stack identifier SID to selectively receive the internal command iCMD and the data "DATA". For example, in the case where the stack identifier SID indicates the first stack identifier SID0, the first core die 420 may receive the internal command iCMD and the data "DATA" transferred through the TSVs 420 and 430. In this case, the second core die 430 may not receive the internal command iCMD and the data "DATA" transferred through the TSVs 420 and 430.

In another embodiment, in the case where the internal command iCMD and the data "DATA" are transferred to the first and second core dies 420 and 430 through separate TSVs, the buffer die 410 may transfer the internal command iCMD and the data "DATA" through separate TSVs to a core die corresponding to the stack identifier SID.

As described above, in the case where the first and second core dies 420 and 430 support the same channel CHa, the stacked memory device 400 may perform a write operation and a read operation on at least one of the first core die 420 and the second core die 430 depending on the stack identifier SID.

Figure 15:
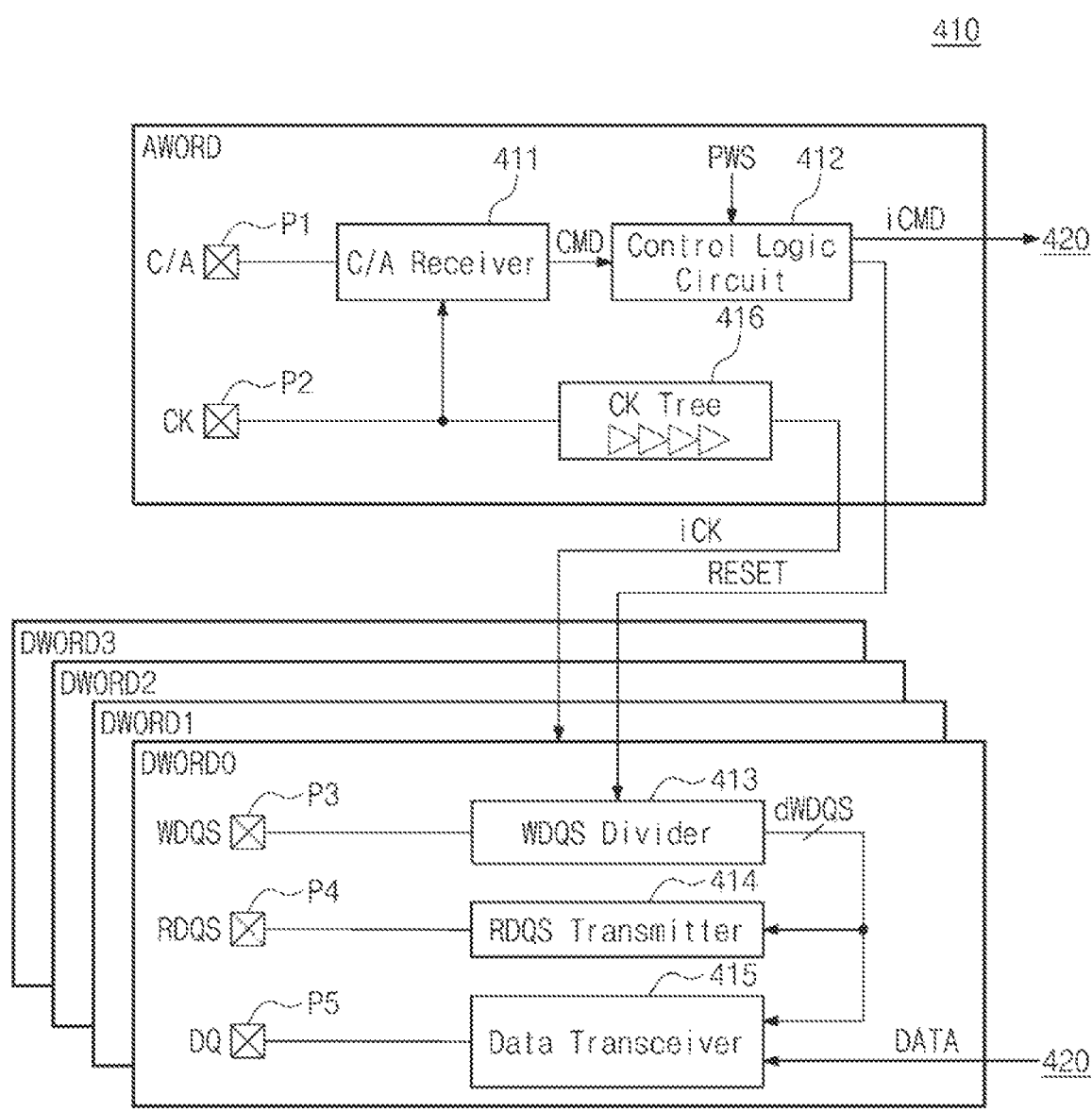
FIG. 15 is a block diagram illustrating an embodiment of a buffer die of the stacked memory device of FIG. 13.

FIG. 15 is a block diagram illustrating an embodiment of a buffer die of the stacked memory device of FIG. 13, according to an embodiment. Referring to FIG. 15, the buffer die 410 may include a command address input/output block AWORD and data input/output blocks DWORD0 to DWORD3. An example is illustrated in FIG. 15 as the buffer die 410 includes the four data input/output blocks DWORD0 to DWORD3, but the number of data input/output blocks that the buffer die 410 includes may be variously changed. For example, the buffer die 410 may include two data input/output blocks.

The command address input/output block AWORD may include the C/A receiver 411, the control logic circuit 412, and a clock tree 416. The C/A receiver 411 may receive the command CMD by latching the command/address signal C/A received from a first pad P1 based on the clock signal CK received from a second pad P2. The control logic circuit 412 may generate the reset signal RESET based on the command CMD or the power state information PWS and may transmit the reset signal RESET to the respective data input/output blocks DWORD0 to DWORD3. The control logic circuit 412 may generate the internal command iCMD depending on the command CMD and may transmit the internal command iCMD to the core die 420. The clock tree 416 may be implemented with an inverter chain including a plurality of inverters. An internal clock signal iCK that the clock tree 416 generates based on the clock signal CK may be transmitted to the respective data input/output blocks DWORD0 to DWORD3.

Each of the data input/output blocks DWORD0 to DWORD3 may receive the internal clock signal iCK and the reset signal RESET from the command address input/output block AWORD. Each of the data input/output blocks DWORD0 to DWORD3 may include the WDQS divider 413, the RDQS transmitter 414, and the data transceiver 415. The WDQS divider 413 may generate the internal write data strobe signals dWDQS based on the write data strobe signal WDQS received from a third pad P3. The WDQS divider 413 may initialize the internal write data strobe signals dWDQS to a reset value(s) in response to the reset signal RESET. The RDQS transmitter 414 may generate the read data strobe signal RDQS based on the internal write data strobe signals dWDQS. The read data strobe signal RDQS may be transmitted to the external host device through a fourth pad P4. The data transceiver 415 may generate the data signal DQ including the data "DATA" transmitted from the core die 420 based on the internal write data strobe signals dWDQS. The data signal DQ may be transmitted to the external host device through a fifth pad P5.

As described above, the second pad P2 through which the clock signal CK is received may be placed at the command address input/output block AWORD, and the third and fourth pads P3 and P4 through which the write data strobe signal WDQS and the read data strobe signal RDQS are respectively received may be placed at the data input/output block DWORD. The clock signal CK received by the command address input/output block AWORD may be transferred to the data input/output block DWORD through the clock tree 416. As such, in the case where the read data strobe signal RDQS is generated based on the clock signal CK, a power noise and the influence of a process-voltagetemperature (PVT) variation may be increased due to an inverter chain placed on a path through which the clock signal CK is transferred. In the case where the read data strobe signal RDQS is generated based on the write data strobe signal WDQS received by the data input/output block DWORD, because an inverter chain is not placed on a path through which the write data strobe signal WDQS is transferred, the power noise and the influence of the PVT variation may be reduced. As such, the reliability of the read data strobe signal RDQS may be improved.

Figure 16:
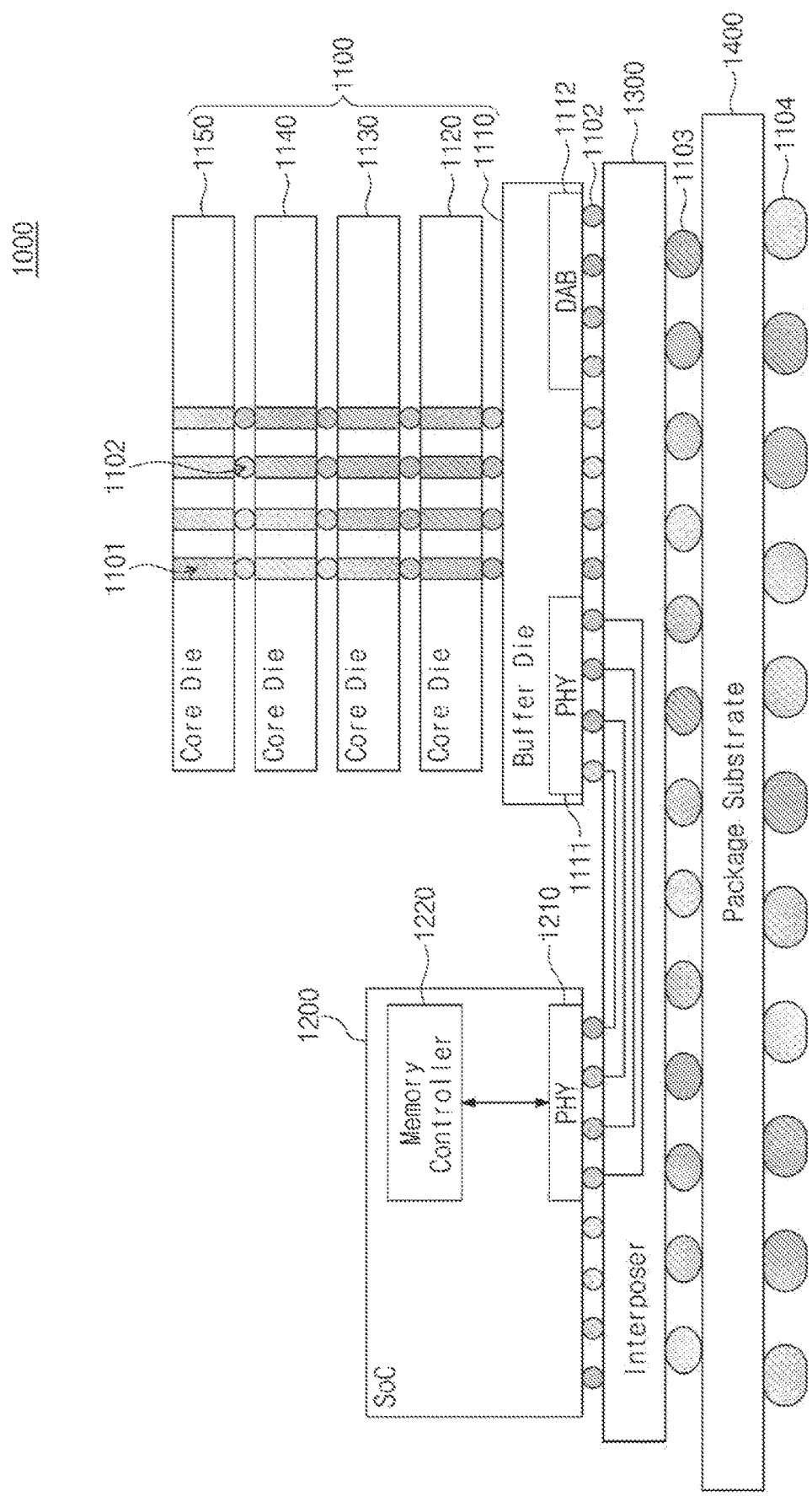
FIG. 16 is a diagram illustrating a semiconductor package according to an embodiment.

FIG. 16 is a diagram illustrating a semiconductor package according to an embodiment. Referring to FIG. 16, a semiconductor package 1000 may include a stacked memory device 1100, a system on chip 1200, an interposer 1300, and a package substrate 1400. The stacked memory device 1100 may include a buffer die 1110 and core dies 1120 to 1150. The buffer die 1110 may correspond to the buffer die 310 of FIG. 12, and the core dies 1120 to 1150 may correspond to the core dies 320 to 350 of FIG. 12, respectively.

Each of the core dies 1120 to 1150 may include a memory cell array. The buffer die 1110 may include a physical layer 1111 and a direct access area (DAB) 1112. The physical layer 1111 may be electrically connected with a physical layer 1210 of the system on chip 1200. Through the physical layer 1111, the stacked memory device 1100 may receive signals from the system on chip 1200 or may transmit signals to the system on chip 1200. The physical layer 1111 may include interface circuits of the buffer die 410 described with reference to FIG. 13.

The direct access area 1112 may provide an access path capable of testing the stacked memory device 1100 without passing through the system on chip 1200. The direct access area 1112 may include a conduction means (e.g., a port or a pin) capable of directly communicating with an external test device. A test signal and data received through the direct access area 1112 may be transmitted to the core dies 1120 to 1150 through TSVs. To test the core dies 1120 to 1150, data read from the core dies 1120 to 1150 may be transmitted to the test device through the TSVs and the direct access area 1112. As such, a direct access test may be performed with respect to the core dies 1120 to 1150.

The buffer die 1110 and the core dies 1120 to 1150 may be electrically connected through TSV 1101 and bumps 1102. The buffer die 1110 may receive signals, which are provided to each channel through the bumps 1102 allocated for each channel, from the system on chip 1200. For example, the bumps 1102 may be micro-bumps.

The system on chip 1200 may execute applications that the semiconductor package 1000 supports, by using the stacked memory device 1100. For example, the system on chip 1200 may include at least one of a central processing unit (CPU), an application processor (AP), a graphic processing unit (GPU), a neural processing unit (NPU), a tensor processing unit (TPU), a vision processing unit (VPU), an image signal processor (ISP), or a digital signal processor (DSP) and may execute specialized calculations.

The system on chip 1200 may include the physical layer 1210 and a memory controller 1220. The physical layer 1210 may include input/output circuits for exchanging signals with the physical layer 1111 of the stacked memory device 1100. The system on chip 1200 may provide various signals to the physical layer 1111 through the physical layer 1210. The signals provided to the physical layer 1111 may be transferred to the core dies 1120 to 1150 through the interface circuits of the physical layer 1111 and the TSVs 1101.

The memory controller 1220 may control overall operations of the stacked memory device 1100. The memory controller 1220 may provide the stacked memory device 1100 with signals for controlling the stacked memory device 1100, through the physical layer 1210. The memory controller 1220 may correspond to the memory controller 100 of FIG. 1.

The interposer 1300 may connect the stacked memory device 1100 and the system on chip 1200. The interposer 1300 may connect the physical layer 1111 of the stacked memory device 1100 and the physical layer 1210 of the system on chip 1200 and may provide physical paths formed by using conductive materials. As such, the stacked memory device 1100 and the system on chip 1200 may be stacked on the interposer 1300 and may exchange signals with each other.

The bumps 1103 may be attached on an upper surface of the package substrate 1400, and solder balls 1104 may be attached on a lower surface of the package substrate 1400. For example, the bumps 1103 may be flip-chip bumps. The interposer 1300 may be stacked on the package substrate 1400 through the bumps 1103. The semiconductor package 1000 may exchange signals with any other external package or semiconductor devices through the solder balls 1104. For example, the package substrate 1400 may be a printed circuit board (PCB).

Figure 17:
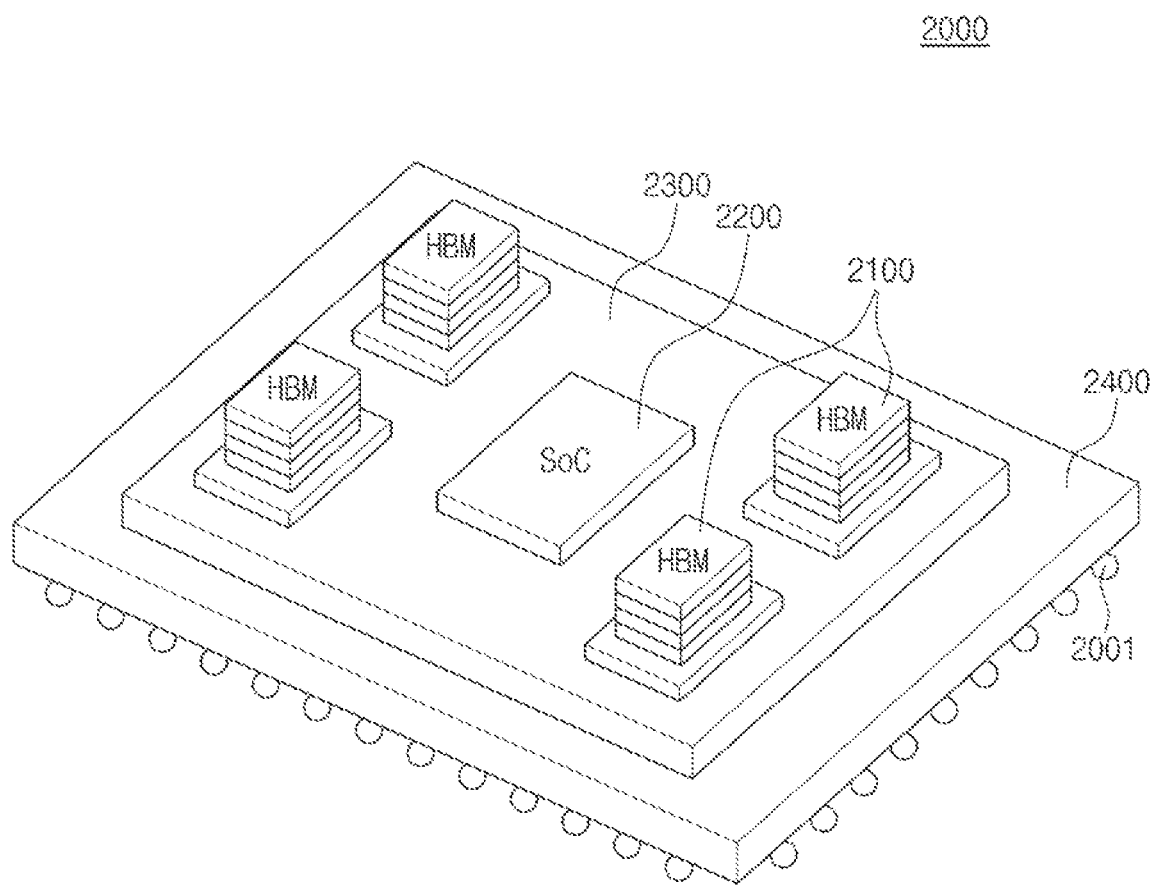
FIG. 17 is a diagram illustrating an implementation example of a semiconductor package according to an embodiment.

FIG. 17 is a diagram illustrating an implementation example of a semiconductor package according to an embodiment. Referring to FIG. 17, a semiconductor package 2000 may include a plurality of stacked memory devices 2100 and a system on chip 2200. The stacked memory devices 2100 and the system on chip 2200 may be stacked on an interposer 2300, and the interposer 2300 may be stacked on a package substrate 2400. The semiconductor package 2000 may exchange signals with any other external package or semiconductor devices through solder balls 2001 attacked on a lower surface of the package substrate 2400.

Each of the stacked memory devices 2100 may be implemented in compliance with the HBM standard. However, embodiments are not limited thereto. For example, each of the stacked memory devices 2100 may be implemented based on a GDDR, HMC, or Wide I/O standard. Each of the stacked memory devices 2100 may correspond to the stacked memory devices 300, 400, or 1100 of FIGS. 12 to 16.

The system on chip 2200 may include at least one processor, such as a CPU, an AP, a GPU, or an NPU, and a plurality of memory controllers for controlling the plurality of stacked memory devices 2100. The system on chip 2200 may exchange signals with the corresponding stacked memory device through a memory controller. The system on chip 2200 may correspond to the system on chip 1200 of FIG. 16.

Figure 18:
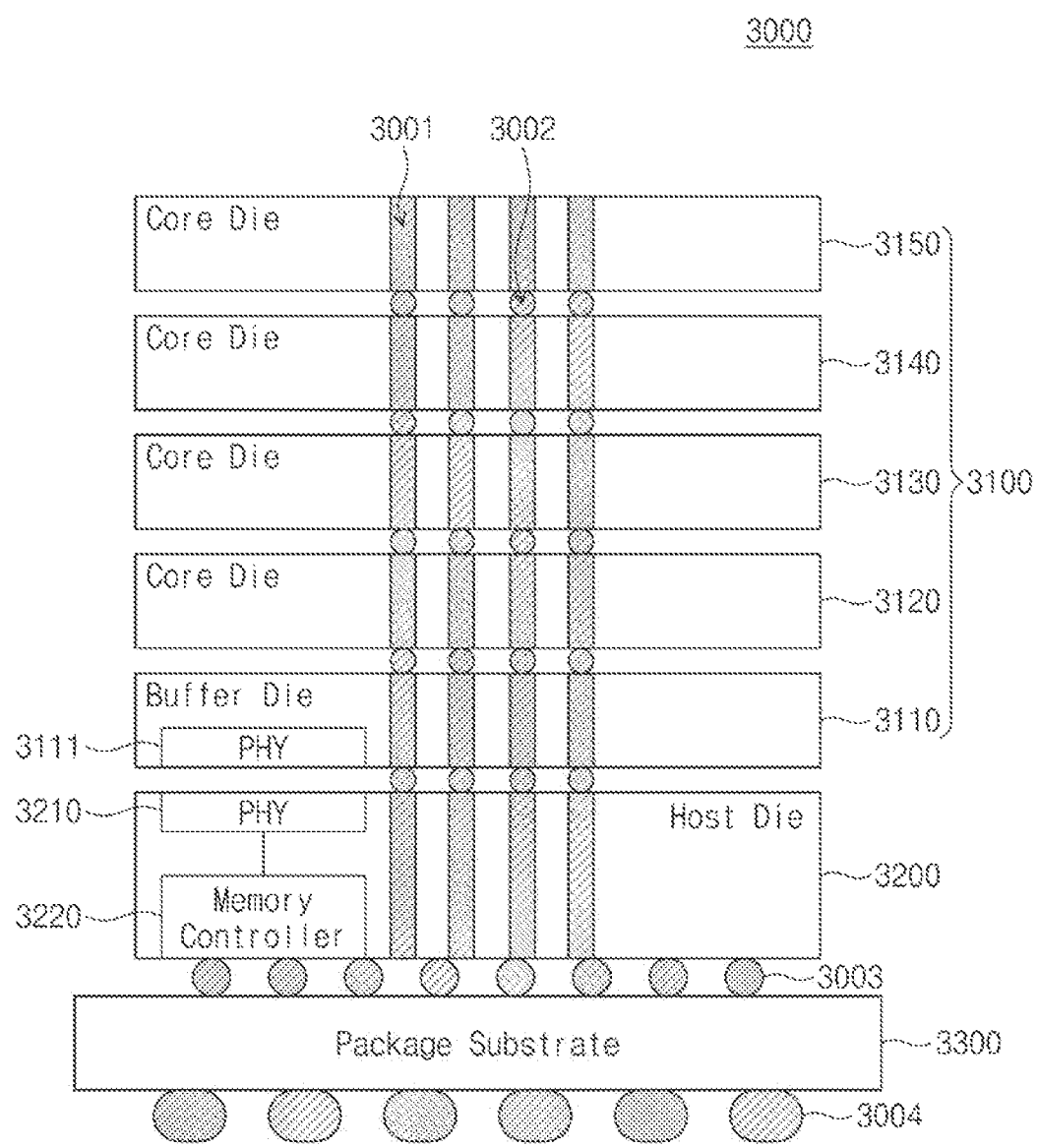
FIG. 18 is a diagram illustrating a semiconductor package according to another embodiment.

FIG. 18 is a diagram illustrating a semiconductor package according to another embodiment. Referring to FIG. 18, a semiconductor package 3000 may include a stacked memory device 3100, a host die 3200, and a package substrate 3300. The stacked memory device 3100 may include a buffer die 3110 and core dies 3120 to 3150. The buffer die 3110 may include a physical layer 3111 for communicating with the host die 3200, and each of the core dies 3120 to 3150 may include a memory cell array. The stacked memory device 3100 may correspond to the stacked memory devices 300 and 400 of FIGS. 12 to 13.

The host die 3200 may include a physical layer 3210 for communicating with the stacked memory device 3100 and a memory controller 3220 for controlling overall operations of the stacked memory device 3100. Also, the host die 3200 may include a processor that control the overall operations of semiconductor package 3000 and executes an application that the semiconductor package 3000 supports. For example, the host die 3200 may include at least one processor such as a CPU, an AP, a GPU, or an NPU.

The stacked memory device 3100 may be disposed on the host die 3200 based on TSVs 3001 so as to be vertically stacked on the host die 3200. As such, the buffer die 3110, the core dies 3120 to 3150, and the host die 3200 may be electrically connected through the TSVs 3001 and bumps 3002 without an interposer. For example, the bumps 3002 may be micro-bumps.

The bumps 3003 may be attached on an upper surface of the package substrate 3300, and solder balls 3004 may be attached on a lower surface of the package substrate 1400. For example, the bumps 3003 may be flip-chip bumps. The host die 3200 may be stacked on the package substrate 3300 through the bumps 3003. The semiconductor package 3000 may exchange signals with any other external package or semiconductor devices through the solder balls 3004.

In another embodiment, the stacked memory device 3100 may be implemented only with the core dies 3120 to 3150 without the buffer die 3110. In this case, each of the core dies 3120 to 3150 may include interface circuits for communicating with the host die 3200 as described with reference to FIGS. 1 to 15. Each of the core dies 3120 to 3150 may exchange signals with the host die 3200 through the TSVs 3001.

Figure 19:
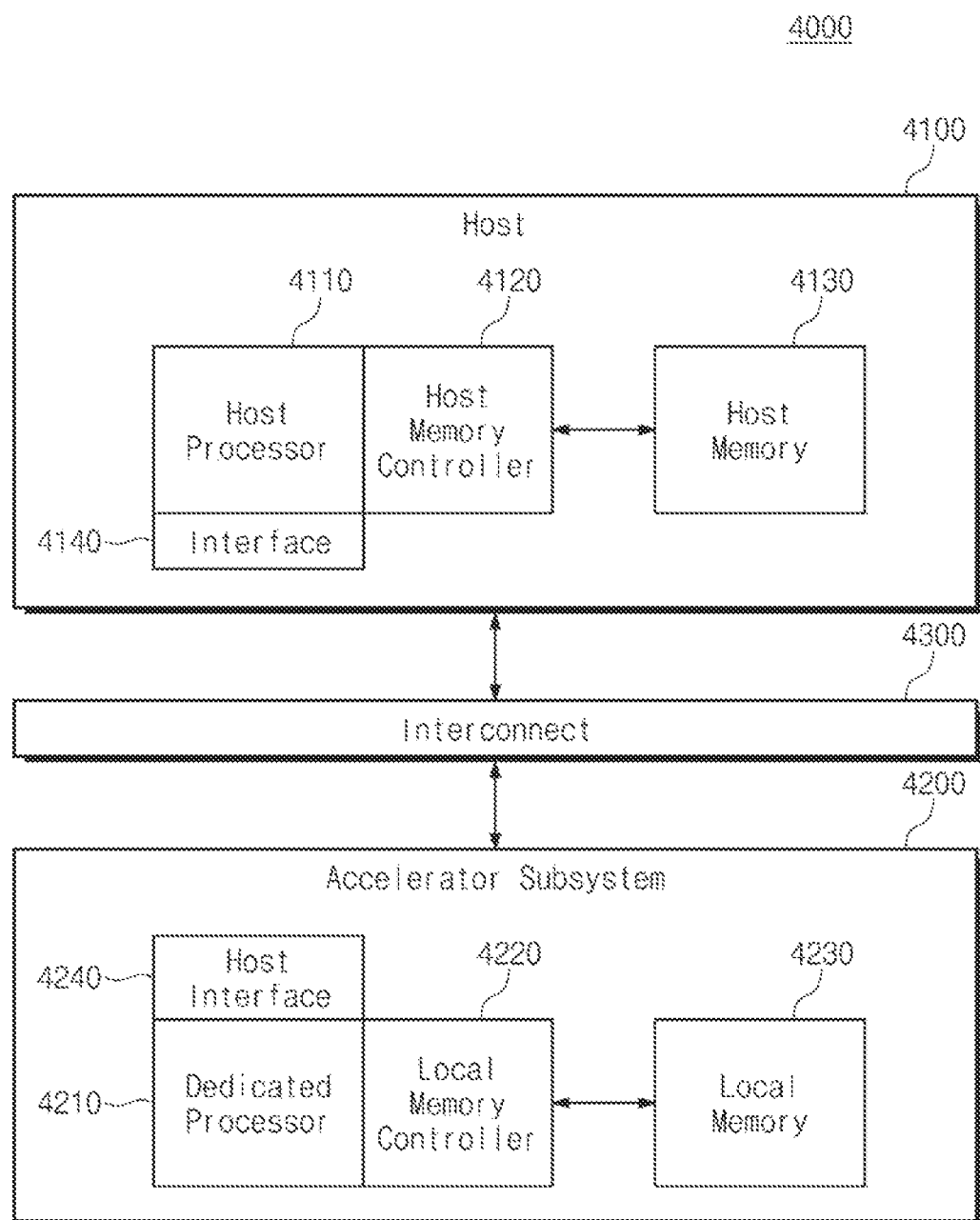
FIG. 19 is a block diagram illustrating a computing system according to an embodiment.

FIG. 19 is a block diagram illustrating a computing system according to an embodiment. A computing system 4000 may be implemented with one electronic device or may be distributed into and implemented with two or more electronic devices. For example, the computing system 4000 may be implemented with at least one of various electronic devices such as a desktop computer, a laptop computer, a tablet computer, a smartphone, an autonomous driving vehicle, a digital camera, a wearable device, a health care device, a server system, a data center, a drone, a handheld game console, an Internet of Things (IoT) device, a graphics accelerator, an AI accelerator.

Referring to FIG. 19, the computing system 4000 may include a host 4100, an accelerator subsystem 4200, and an interconnect 4300. The host 4100 may control overall operations of the accelerator subsystem 4200, and the accelerator subsystem 4200 may operate under control of the host 4100. The host 4100 and the accelerator subsystem 4200 may be connected through the interconnect 4300. Various signals and data may be exchanged between the host 4100 and the accelerator subsystem 4200 through the interconnect 4300.

The host 4100 may include a host processor 4110, a host memory controller 4120, a host memory 4130, and an interface 4140. The host processor 4110 may control overall operations of the computing system 4000. The host processor 4110 may control the host memory 4130 through the host memory controller 4120. For example, the host processor 4110 may read data from the host memory 4130 or may store data in the host memory 4130. The host processor 4110 may control the accelerator subsystem 4200 connected through the interconnect 4300. For example, the host processor 4110 may transmit a command to the accelerator subsystem 4200 and may assign a task to the accelerator subsystem 4200.

The host processor 4110 may be a general-purpose processor or a main processor that performs general calculations associated with various operations of the computing system 4000. For example, the host processor 4110 may be a CPU or an AP.

The host memory 4130 may be a main memory of the computing system 4000. The host memory 4130 may store data processed by the host processor 4110 or may store data received from the accelerator subsystem 4200. For example, the host memory 4130 may be implemented with a DRAM.

The interface 4140 may be configured to allow the host 4100 to communicate with the accelerator subsystem 4200. Through the interface 4140, the host processor 4110 may transmit control signals and data to the accelerator subsystem 4200 and may receive signals and data from the accelerator subsystem 4200. In an exemplary embodiment, the host processor 4110, the host memory controller 4120, and the interface 4140 may be implemented with one chip.

The accelerator subsystem 4200 may perform a specific function under control of the host 4100. For example, the accelerator subsystem 4200 may perform calculations specialized for a specific application under control of the host 4100. The accelerator subsystem 4200 may be implemented in various types such as a module type, a card type, a package type, a chip type, and a device type, so as to be physically or electrically connected with the host 4100 or so as to be wiredly or wirelessly connected with the host 4100. For example, the accelerator subsystem 4200 may be implemented with one of the semiconductor packages described with reference to FIGS. 16 to 18. For example, the accelerator subsystem 4200 may be implemented in the form of a graphics card or an accelerator card. For example, the accelerator subsystem 4200 may be implemented in the form of a field programmable gate array (FPGA), an application specific integrated circuit (ASIC), etc.

In an exemplary embodiment, the accelerator subsystem 4200 may be implemented by one of various packaging techniques. For example, the accelerator subsystem 4200 may be implemented by a packaging technique such as a ball grid arrays (BGAs) technique, a multi-chip package (MCP) technique, a system on package (SOP) technique, a system in package (SIP) technique, a package on package (POP) technique, a chip scale packages (CSPs) technique, a wafer level package (WLP) technique, or a panel level package (PLP) technique. For example, all or a part of components of the accelerator subsystem 4200 may be connected through copper-to-copper bonding. For example, all or a part of the components of the accelerator subsystem 4200 may be connected through an interposer such as a silicon interposer, an organic interposer, a glass interposer, or an active interposer. For example, all or a part of components of the accelerator subsystem 4200 may be stacked based on TSVs. For example, all or a part of the components of the accelerator subsystem 4200 may be connected through a high-speed connection path (e.g., a silicon bridge).

The accelerator subsystem 4200 may include a dedicated processor 4210, a local memory controller 4220, a local memory 4230, and a host interface 4240. The dedicated processor 4210 may operate under control of the host processor 4110. For example, the dedicated processor 4210 may read data from the local memory 4230 through the local memory controller 4220 in response to a command of the host processor 4110. The dedicated processor 4210 may process the read data by performing calculation on the read data. The dedicated processor 4210 may transfer the processed data to the host processor 4110 or may store the processed data in the local memory 4230.

The dedicated processor 4210 may perform calculations specialized for a specific application based on a value stored in the local memory 4230. For example, the dedicated processor 4210 may perform calculations specialized for applications such as artificial intelligence, streaming analysis, video transcoding, data indexing, data encoding/decoding, and data encryption. As such, the dedicated processor 4210 may process various types of data such as image data, voice data, motion data, biometric data, and a key value. For example, the dedicated processor 4210 may include at least one of a GPU, an NPU, a TPU, a VPU, an ISP, and a DSP.

The dedicated processor 4210 may include one processor core or may include a plurality of processor cores such as a dual-core, a quad-core, or a hexa-core. In an exemplary embodiment, the dedicated processor 4210 may include cores, the number of which is more than the number of cores of the host processor 4110, for the purpose of performing calculation specialized for parallelism. For example, the dedicated processor 4210 may include 1000 or more cores.

In an exemplary embodiment, the dedicated processor 4210 may be a processor specialized for image data calculation. In this case, the dedicated processor 4210 may read image data stored in the local memory 4230 through the local memory controller 4220 and may perform calculation on the read data. The dedicated processor 4210 may transfer the calculation result to the host processor 4110 or may store the calculation result in the local memory 4230. The host processor 4110 may store the transferred calculation result in the host memory 4130 or in a frame buffer allocated to a separate memory. The data stored in the frame buffer may be transferred to a separate display device.

In an exemplary embodiment, the dedicated processor 4210 may be a processor specialized for neural network based training and inference. The dedicated processor 4210 may read neural network parameters (e.g., a neural network model parameter, a weight, and a bias) from the local memory 4230 and may perform training or inference on the read neural network parameters. The neural network parameters may be provided from the host processor 4110, may be values obtained through the processing of the dedicated processor 4210, or may be values stored in advance. For example, the host processor 4110 may provide weight parameters for inference to the dedicated processor 4210. In this case, the weight parameters may be parameters that are updated through the training of the host processor 4110. The dedicated processor 4210 may perform training or inference through matrix multiplication and accumulation based on the neural network parameters of the local memory 4230. The dedicated processor 4210 may transfer the calculation result to the host processor 4110 or may store the calculation result in the local memory 4230.

The local memory controller 4220 may control overall operations of the local memory 4230. In an exemplary embodiment, the local memory controller 4220 may process data to be written in the local memory 4230 and may write the processed data in the local memory 4230. Alternatively, the local memory controller 4220 may process data read from the local memory 4230. For example, the local memory controller 4220 may perform error correction code (ECC) encoding and ECC decoding, may verify data in a cyclic redundancy check (CRC) manner, or may perform data encryption or data decryption. The local memory controller 4220 may correspond to the memory controller described with reference to FIGS. 1 to 18. For example, for a write operation and a read operation of the local memory 4230, the local memory controller 4220 may transmit the toggling write data strobe signal WDQS to the local memory 4230. In this case, a sum of the number of pre-amble cycles of the write data strobe signal WDQS and the number of post-amble cycles of the write data strobe signal WDQS may be even-numbered.

The local memory 4230 may be used only by the dedicated processor 4210. In an exemplary embodiment, the local memory 4230 may be mounted on one substrate together with the dedicated processor 4210 or may be implemented in the form of a die, a chip, a package, a module, a card, or a device so as to be connected with the dedicated processor 4210 based on a separate connector. The local memory 4230 may correspond to the memory device or the stacked memory device described with reference to FIGS. 1 to 18. For example, the local memory 4230 may divide a frequency of the write data strobe signal WDQS transmitted from the local memory controller 4220 and may generate the internal write data strobe signals dWDQS having different phases at low power. The local memory 4230 may communicate with the local memory controller 4220 based on the internal write data strobe signals dWDQS.

In an exemplary embodiment, the local memory 4230 may include 32 or more data pins. For example, the local memory 4230 may include 1024 or more data pins for the purpose of providing a wide bandwidth. As such, a bus width of each chip of the local memory 4230 may be greater than a bus width of each chip of the host memory 4130.

In an exemplary embodiment, the local memory 4230 may operate based on a DDR, LPDDR, GDDR, HBM, HMC, or Wide I/O standard interface. However, embodiments are not limited thereto. For example, the local memory 4230 may operate based on various standard interfaces.

In an exemplary embodiment, the local memory 4230 may include a logic circuit capable of performing some calculations. The logic circuit may perform a linear operation, a comparison operation, a compression operation, a data conversion operation, an arithmetic operation on data read from the local memory 4230 or data to be written in the local memory 4230. As such, the size of data processed by the logic circuit may be reduced. In the case where the size of data is reduced, bandwidth efficiency between the local memory 4230 and the local memory controller 4220 may be improved.

The host interface 4240 may be configured to allow the accelerator subsystem 4200 to communicate with the host 4100. The accelerator subsystem 4200 may transmit a signal and data to the host 4100 through the host interface 4240 and may receive a control signal and data from the host 4100. In an exemplary embodiment, the dedicated processor 4210, the local memory controller 4220, and the host interface 4240 may be implemented with one chip.

The interconnect 4300 may provide a transmission path between the host 4100 and the accelerator subsystem 4200 and may perform a role of a data bus or a data link. The data transmission path may be established wiredly or wirelessly. The interface 4140 and the host interface 4240 may communicate through the interconnect 4300 based on a given protocol. For example, the interfaces 4140 and 4240 may communicate with each other based on one of various standards such as ATA (Advanced Technology Attachment), SATA (Serial ATA), e-SATA (external SATA), SCSI (Small Computer Small Interface), SAS (Serial Attached SCSI), PCI (Peripheral Component Interconnection), PCIe (PCI express), NVMe (NVM express), AXI (Advanced eXtensible Interface), AMBA (ARM Microcontroller Bus Architecture), IEEE 1394, USB (Universal Serial Bus), SD (Secure Digital) card, MMC (multi-media card), eMMC (embedded multi-media card), UFS (Universal Flash Storage), CF (compact flash), and Gen-Z. Alternatively, the interfaces 4140 and 4240 may communicate with each other based on a communication link between devices such as openCAPI (Coherent Accelerator Processor Interface), CCIX (Cache Coherent Interconnect for Accelerators), CXL (Compute Express Link), and NVLINK. Alternatively, the interfaces 4140 and 4240 may communicate with each other based on a wireless communication technology such as LTE, 5G, LTE-M, NB-IoT, LPWAN, Bluetooth, NFC (Near Field Communication), Zigbee, Z-Wave, or WLAN.

In an exemplary embodiment, the accelerator subsystem 4200 may further include a sensor capable of sensing image data, voice data, motion data, biometric data, and ambient environment information. In an exemplary embodiment, in the case where the sensor is included in the accelerator subsystem 4200, the sensor may be connected with any other components (e.g., the dedicated processor 4210 or the local memory 4230) based on the above packaging technique. The accelerator subsystem 4200 may process data sensed through the sensor based on specific operations.

An example is illustrated in FIG. 19 in which the dedicated processor 4210 uses one local memory 4230 through one local memory controller 4220, but embodiments are not limited thereto. For example, the dedicated processor 4210 may use a plurality of local memories through one local memory controller 4220. For another example, the dedicated processor 4210 may use a plurality of local memories through a plurality of local memory controllers respectively corresponding to the local memories.

A memory device according to various embodiments described herein may generate internal write data strobe signals based on a write data strobe signal provided from a memory controller for the purpose of exchanging data at high speed. In this case, the memory device may initialize the internal write data strobe signals to given values and thus may generate the internal write data strobe signals having desired phases in a write operation and a read operation. As such, the memory device may not separately perform auto-synchronization for adjusting the phases of the internal write data strobe signals. That is, auto-synchronization and circuitry for implementing auto-synchronization may be omitted. Accordingly, power consumption of the memory device may be reduced.

The memory device according to various embodiments described above may generate a read data strobe signal to be provided to a memory controller based on the write data strobe signal, thus improving the reliability of the read data strobe signal.

The memory controller according to various embodiments described above may generate a clock signal and the write data strobe signal based on one phase locked loop. As such, power consumption of the memory controller may be reduced.

While various exemplary embodiments have been described, it will be apparent to those of ordinary skill in the art that various changes and modifications may be made thereto without departing from the spirit and scope of the present disclosure as set forth in the following claims.

What is claimed is:

1. A method for using a high bandwidth memory controller, the method comprising:
providing a clock signal having a first clock frequency;
providing a write strobe signal having a second clock frequency;
providing a write command/address signal based on the clock signal;
providing a write data signal based on the write strobe signal;
generating, by a phase locked loop, a first internal clock signal;
generating, by a phase controller, a second internal clock signal based on the first internal clock signal;
dividing, by an internal clock divider, the first internal clock signal to generate a first divided internal clock signal and a second divided internal clock signal;
generating, by a first transmitter, the write data signal including write data based on the second internal clock signal;
generating, by a second transmitter, the first internal clock signal as the write strobe signal;
generating, by a third transmitter, the first divided internal clock signal as the clock signal; and
generating, by a fourth transmitter, the write command/address signal based on the second divided internal clock signal,
wherein the first clock frequency is half of the second clock frequency, and
wherein the write strobe signal has two cycles of pre-amble before the write data signal and the write strobe signal has two cycles of post-amble after the write data signal.

2. The method of claim 1, wherein the clock signal and the write strobe signal are generated from a same phase locked loop.

3. The method of claim 1, wherein a sum of a number of pre-amble cycles of the write strobe signal and a number of post-amble cycles of the write strobe signal is even-numbered.

4. The method of claim 1, wherein the write strobe signal maintains a static low value or a static high value before the write strobe signal starts to toggle.

5. The method of claim 1, wherein the first internal clock signal and the second internal clock signal are 90 degrees out of phase.

6. The method of claim 1, wherein an edge timing of the first divided internal clock signal is identical to an edge timing of the first internal clock signal.

7. The method of claim 1, wherein the first divided internal clock signal the second divided internal clock signal are 270 degree out of phase.

8. A method for using a high bandwidth memory controller, the method comprising:
providing a clock signal having a first clock frequency;
providing a write strobe signal having a second clock frequency;
providing a read command/address signal based on the clock signal;
receiving a read data signal based on a read strobe signal generated from the write strobe signal; and
wherein the first clock frequency is half of the second clock frequency, and
wherein the read strobe signal has a plurality of pre-amble cycles before the read data signal and the read strobe signal has a plurality of post-amble cycles after the read data signal.

9. The method of claim 8, wherein the clock signal and the read strobe signal are generated from a same phase locked loop.

10. The method of claim 8, wherein a sum of a number of pre-amble cycles of the write strobe signal and a number of post-amble cycles of the write strobe signal is even-numbered.

11. The method of claim 8, wherein the read strobe signal maintains a static low value or a static high value before the read strobe signal starts to toggle.

12. A memory controller comprising:
a phase locked loop configured to generate a first internal clock signal;
a phase controller configured to generate a second internal clock signal based on the first internal clock signal;
an internal clock divider configured to divide the first internal clock signal to generate a first divided internal clock signal and a second divided internal clock signal;
a first transmitter configured to transmit a write data signal including write data based on the second internal clock signal;
a second transmitter configured to transmit the first internal clock signal as a write strobe signal;
a third transmitter configured to transmit the first divided internal clock signal as a clock signal; and
a fourth transmitter configured to transmit the write command/address signal based on the second divided internal clock signal.

13. The memory controller of claim 12, wherein the clock signal and the write strobe signal are generated from a same phase locked loop.

14. The memory controller of claim 12, wherein a sum of a number of pre-amble cycles of the write strobe signal and a number of post-amble cycles of the write strobe signal is even-numbered.

15. The memory controller of claim 12, wherein the write strobe signal maintains a static low value or a static high value before the write strobe signal starts to toggle.

16. The memory controller of claim 12, wherein the first internal clock signal and the second internal clock signal are 90 degrees out of phase.

17. The memory controller of claim 12, wherein an edge timing of the first divided internal clock signal is identical to an edge timing of the first internal clock signal.

18. The memory controller of claim 12, wherein the first divided internal clock signal the second divided internal clock signal are 270 degree out of phase.

19. The memory controller of claim 18, wherein a frequency of the first divided internal clock signal and the second divided internal clock signal is half a frequency of the second internal clock signal.

* * * * *